(12) United States Patent
Cho et al.

(10) Patent No.: US 10,679,563 B2
(45) Date of Patent: Jun. 9, 2020

(54) WIRELESS DISPLAY PANEL WITH ANTENNA DESIGN AND DISPLAY DEVICE USING THE SAME

(71) Applicant: a.u. Vista, Inc., Irvine, CA (US)

(72) Inventors: Wei-Min Cho, Hsinchu (TW); Yu-Sheng Huang, Hsinchu (TW)

(73) Assignee: A.U. VISTA, INC., Irvine, CA (US)

( * ) Notice: Subject to any disclaimer, the term of this patent is extended or adjusted under 35 U.S.C. 154(b) by 0 days.

(21) Appl. No.: 16/282,644

(22) Filed: Feb. 22, 2019

(65) Prior Publication Data

US 2020/0020276 A1    Jan. 16, 2020

Related U.S. Application Data

(60) Provisional application No. 62/696,031, filed on Jul. 10, 2018.

(51) Int. Cl.
*G09G 3/3258* (2016.01)
*H01L 27/12* (2006.01)
(Continued)

(52) U.S. Cl.
CPC ......... *G09G 3/3258* (2013.01); *G02F 1/1368* (2013.01); *G02F 1/13452* (2013.01);
(Continued)

(58) Field of Classification Search
CPC ......... G09G 3/3258; G09G 2300/0439; G09G 2320/0219; G09G 2300/0885; G09G 2300/0814; G09G 2370/16; G09G 2300/0426; G09G 2300/04; G09G 3/2003; G09G 3/3659; G09G 3/3614; G09G 3/3677; G09G 3/32; G02F 1/1368; G02F 1/136286; G02F 1/13452; H01Q 1/24; H05K 1/0213; H01L 27/1255; H01L 27/3276; H01L 27/326; H01L 27/3211; H01L 25/167; H01L 27/1218

See application file for complete search history.

(56) References Cited

U.S. PATENT DOCUMENTS 9,466,018 B2 * 10/2016 Park ................... G06K 19/0772
9,608,317 B2   3/2017 Rahman et al.
(Continued)

*Primary Examiner* — Rodney Amadiz
(74) *Attorney, Agent, or Firm* — Tim Tingkang Xia, Esq.; Locke Lord LLP

(57) ABSTRACT

An active matrix display panel includes a pixel structure having multiple pixels arranged in an array, and a receiver antenna structure. The receiver antenna structure include multiple first receiver antennas having a greater size for providing power voltages to the pixels, and multiple second receiver antennas having a greater resonance frequency for providing data signals to the pixels. Each first receiver antenna and one or more second receiver antennas being surrounded by the first receiver antenna form a receiver antenna group. In the receiver antenna group, each second receiver antenna corresponds to multiple pixels. For each pixel, in a reset period, the pixel circuit controls a pixel capacitor to reset. In a data writing period, the pixel circuit controls the corresponding second receiver antenna to charge the pixel capacitor. In an emission period, the charged pixel capacitor controls the corresponding first receiver antenna to provide the power voltage.

20 Claims, 26 Drawing Sheets

(51) Int. Cl.

| | |
|---|---|
| *H05K 1/02* | (2006.01) |
| *H01Q 1/24* | (2006.01) |
| *G02F 1/1345* | (2006.01) |
| *G02F 1/1362* | (2006.01) |
| *G02F 1/1368* | (2006.01) |
| *G09G 3/32* | (2016.01) |
| *G09G 3/36* | (2006.01) |
| *H01L 25/16* | (2006.01) |
| *G09G 3/20* | (2006.01) |
| *H01L 27/32* | (2006.01) |

(52) U.S. Cl.
CPC ..... *G02F 1/136286* (2013.01); *G09G 3/2003* (2013.01); *G09G 3/32* (2013.01); *G09G 3/3614* (2013.01); *G09G 3/3659* (2013.01); *G09G 3/3677* (2013.01); *H01L 25/167* (2013.01); *H01L 27/1218* (2013.01); *H01L 27/326* (2013.01); *H01L 27/3211* (2013.01); *H01L 27/3276* (2013.01); *H01Q 1/24* (2013.01); *H05K 1/0213* (2013.01); *G09G 2300/0408* (2013.01); *G09G 2300/0426* (2013.01); *G09G 2300/0439* (2013.01); *G09G 2300/0814* (2013.01); *G09G 2300/0885* (2013.01); *G09G 2320/0219* (2013.01); *G09G 2370/16* (2013.01); *H01L 27/1255* (2013.01)

(56) References Cited

U.S. PATENT DOCUMENTS

| | | | | |
|---|---|---|---|---|
| 9,852,691 | B2* | 12/2017 | Hyun | H02J 5/005 |
| 10,068,677 | B2* | 9/2018 | Liu | G21K 1/04 |
| 10,140,949 | B2* | 11/2018 | Seo | G09G 5/003 |
| 10,276,088 | B2* | 4/2019 | Li | G09G 3/22 |
| 10,553,173 | B2* | 2/2020 | Huang | G09G 3/3688 |
| 2010/0079416 | A1* | 4/2010 | Chung | G02F 1/13336 345/204 |
| 2010/0182207 | A1* | 7/2010 | Miyata | H01L 27/13 343/702 |

* cited by examiner

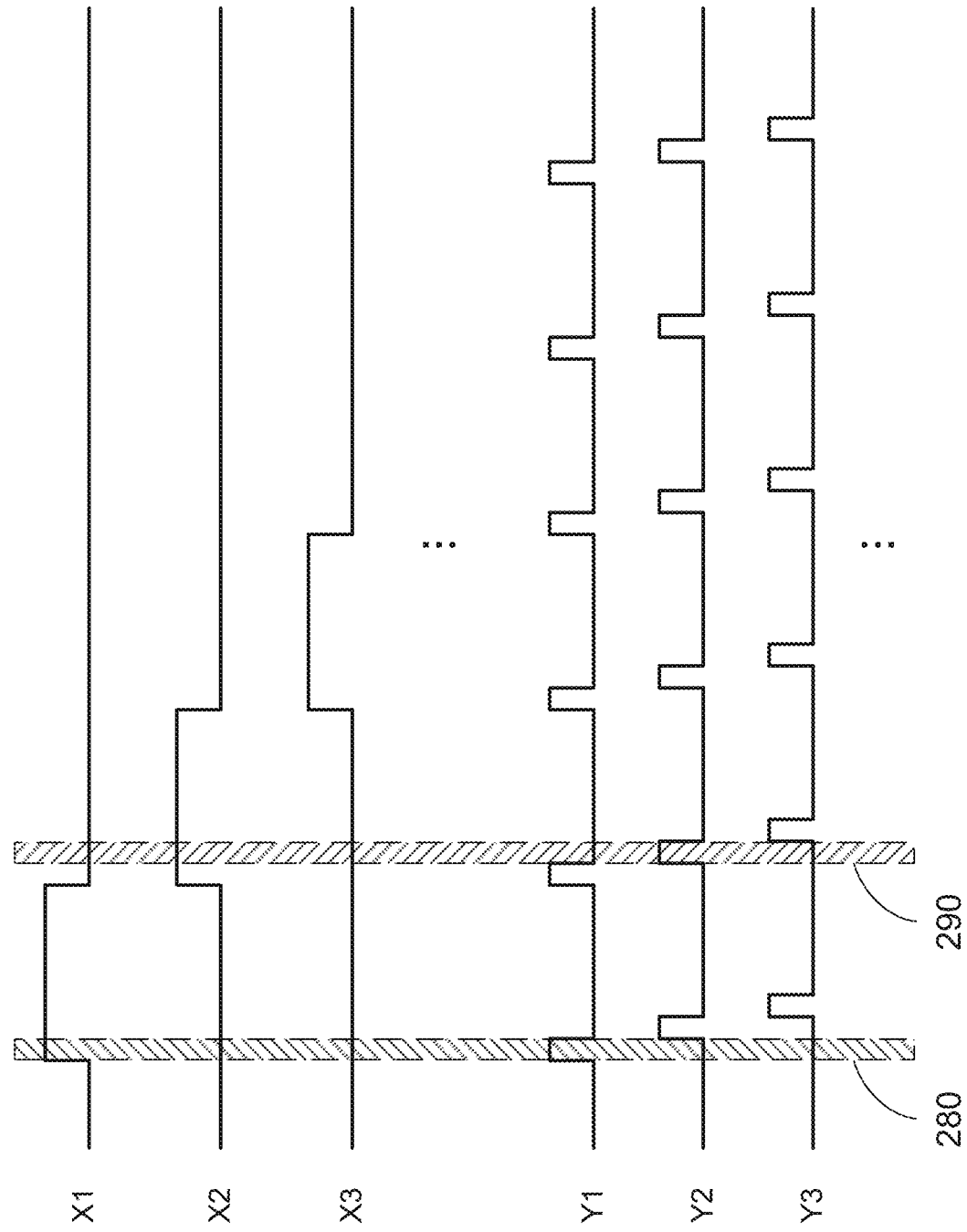

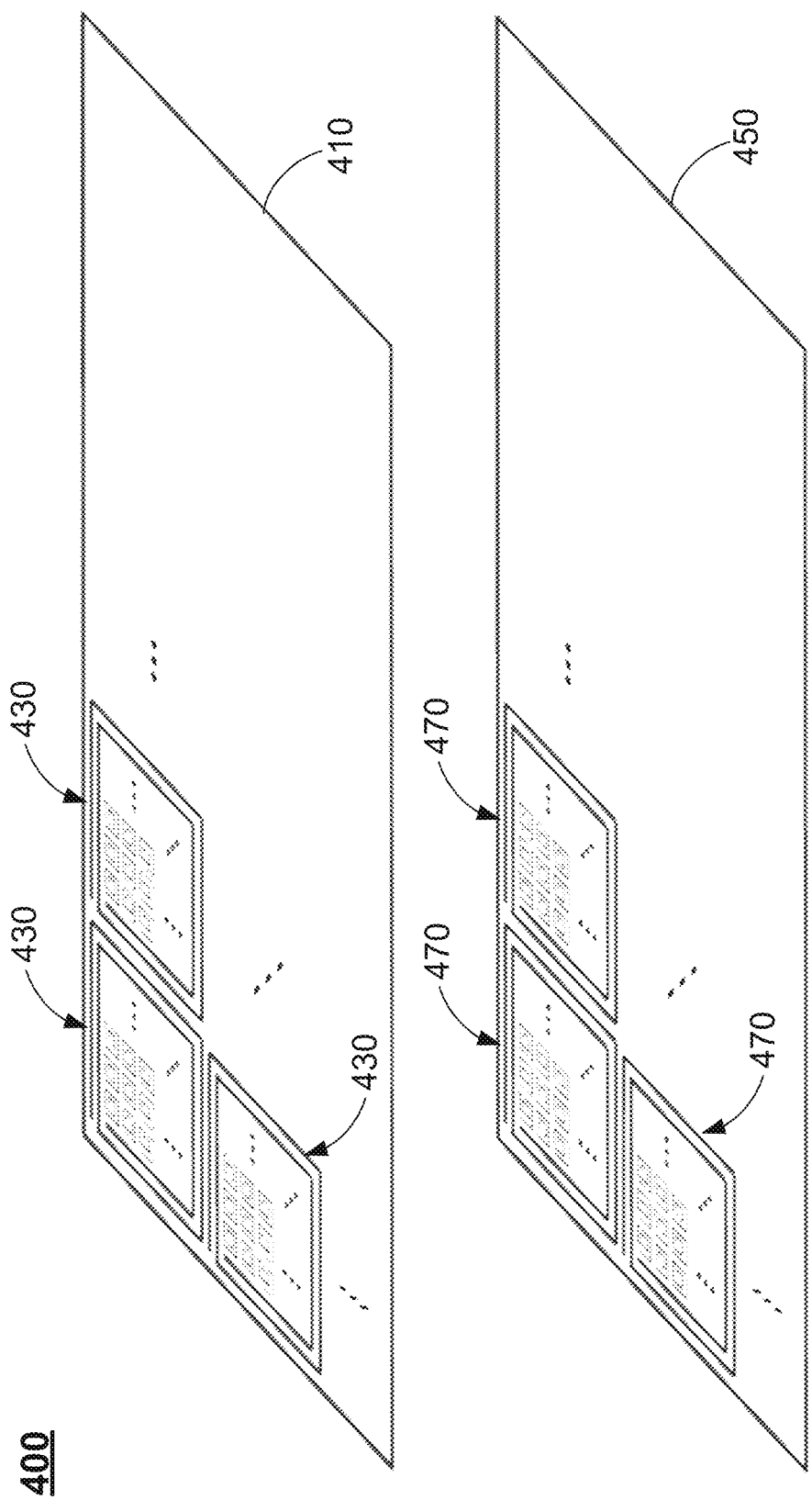

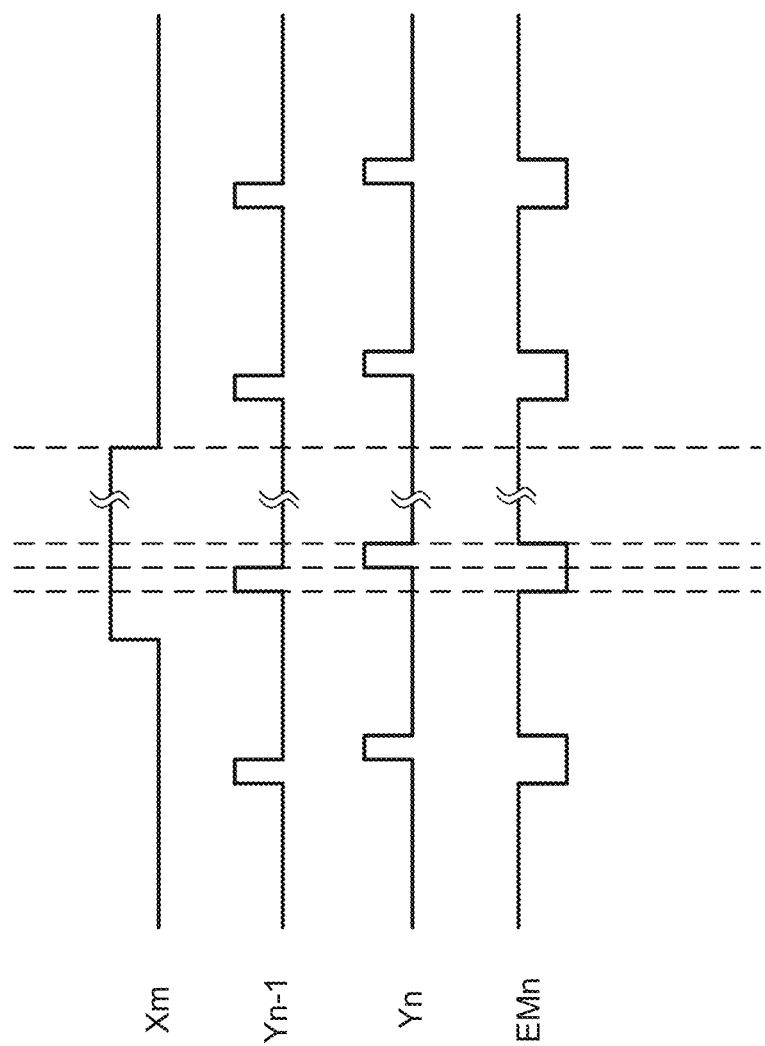

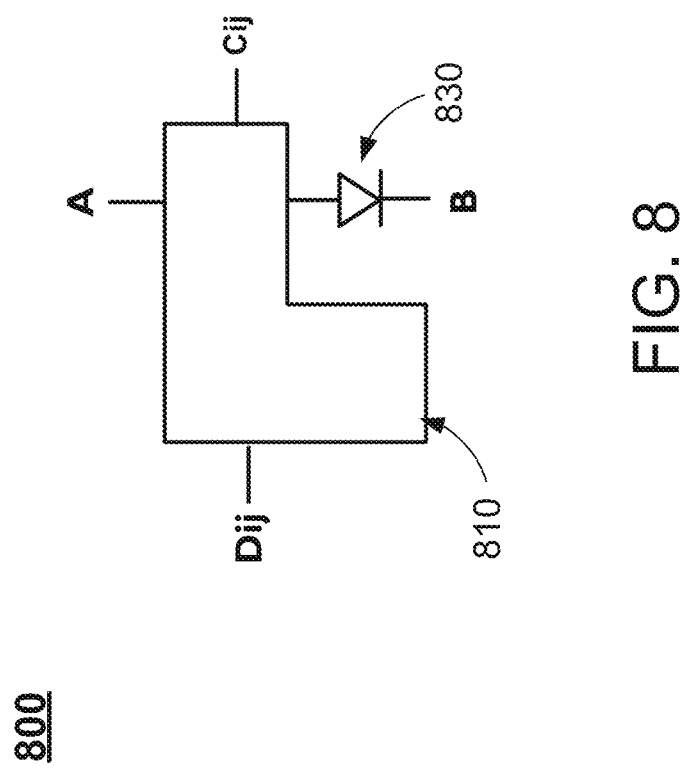

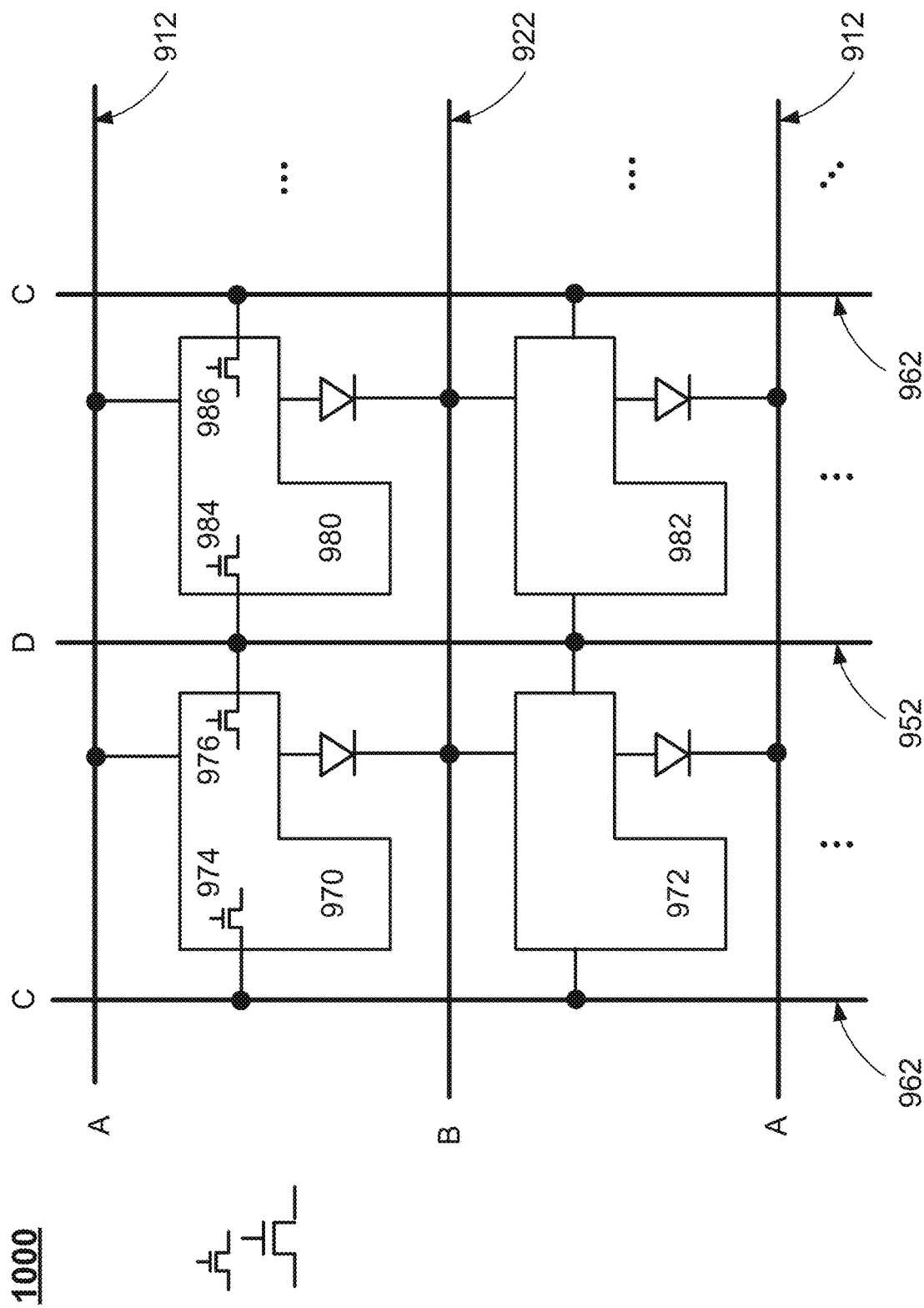

WIRELESS DISPLAY PANEL WITH ANTENNA DESIGN AND DISPLAY DEVICE USING THE SAME

CROSS-REFERENCE TO RELATED PATENT APPLICATION

This non-provisional application claims priority to and the benefit of, pursuant to 35 U.S.C. § 119(e), U.S. provisional patent application Ser. No. 62/696,031 filed Jul. 10, 2018. The disclosure of the above application is incorporated herein in its entirety by reference.

FIELD

The disclosure relates generally to display technology, and more particularly to a wireless display panel having an antenna design for both data and power transmission and display devices using the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Generally, a display panel may include a peripheral non-display area, which is reserved for a plurality of integrated circuits (ICs), as the data drivers that provide data signals to the pixels of the display panel. In order to reduce or eliminate the peripheral non-display area, wireless transmission technology may be used to transmit the data signals, thus achieving high speed data transmission. For example, a wireless display device may include a transmitter antenna structure and a receiver antenna structure correspondingly provided, with the transmitter antenna structure having one or more transmitter antennas Tx and the receiver antenna structure having one or more receiver antennas Rx, thus forming one or more wireless data transmission pairs Tx-Rx. However, the wireless data transmission pairs Tx-Rx are generally used to transmit one type of signals, such as data signals.

Therefore, a heretofore unaddressed need exists in the art to address the aforementioned deficiencies and inadequacies.

SUMMARY

One aspect of the disclosure relates to an active matrix display panel, which includes: a pixel structure corresponding to a display area, comprising a plurality of pixels arranged in an array having M columns and N rows, wherein M and N are positive integers; a receiver antenna structure disposed on the pixel structure, the receiver antenna structure comprising a plurality of first receiver antennas configured to provide power voltages to the pixels and a plurality of second receiver antennas configured to provide data signals to the pixels, wherein each of the first receiver antennas has a first resonance frequency, each of the second receiver antennas has a second resonance frequency greater than the first resonance frequency, and a first size of each of the first receiver antennas is greater than a second size of each of the second receiver antennas; wherein the first receiver antennas and the second receiver antennas form a plurality of receiver antenna groups, each of the receiver antenna groups comprises one of the first receiver antennas and at least one of the second receiver antennas being surrounded by the one of the first receiver antennas, and each of the second receiver antennas corresponds to at least one of the M columns and at least one of the N rows of the pixels.

In certain embodiments, the first resonance frequency is in a range of 100 kHz to 1 MHz, and the second resonance frequency is 10 MHz.

In certain embodiments, the first size of each of the first receiver antennas is 4 cm*4 cm, and the second size of each of the second receiver antennas is 8 mm*10 mm.

In certain embodiments, the active matrix display panel further includes: a printed circuit board (PCB); and a transmitter antenna structure disposed on the PCB and spatially separated from the receiver antenna structure, configured to transmit wireless signals to the receiver antenna structure such that the receiver antenna structure generates the data signals and the power voltages, wherein the transmitter antenna structure comprises a plurality of first transmitter antennas and a plurality of second transmitter antennas, each of the first transmitter antennas one-to-one corresponds to one of the first receiver antennas and has an identical resonance frequency to the first resonance frequency of the corresponding one of the first receiver antennas, and each of the second transmitter antennas one-to-one corresponds to one of the second receiver antennas and has an identical resonance frequency to the second resonance frequency of the corresponding one of the second receiver antennas;

In certain embodiments, each of the first receiver antennas and each of the second receiver antennas has an inner feeding end and an outer feeding end; one of the inner feeding end and the outer feeding end of each of the first receiver antennas functions as a power feeding end, and the other of the inner feeding end and the outer feeding end of each of the first receiver antennas functions as a power reference end being provided with a power reference voltage; and one of the inner feeding end and the outer feeding end of each of the second receiver antennas functions as a data feeding end, and the other of the inner feeding end and the outer feeding end of each of the second receiver antennas functions as a data reference end being provided with a data reference voltage.

In certain embodiments, each of the pixels includes: a pixel circuit electrically connected to a corresponding first receiver antenna of the first receiver antennas and a corresponding second receiver antenna of the second receiver antennas, wherein the pixel circuit has a pixel capacitor; and a light emitting diode (LED) electrically connected to the corresponding first receiver antenna and the pixel circuit, wherein: in a reset period, the pixel circuit is configured to control the pixel capacitor to reset; in a data writing period immediately after the reset period, the pixel circuit is configured to control the corresponding second receiver antenna to provide a corresponding data signal to the pixel capacitor to charge the pixel capacitor to a pixel voltage level; and in an emission period immediately after the data writing period, the charged pixel capacitor of the pixel circuit is configured to control the corresponding first receiver antenna to provide a corresponding power voltage to the LED to drive the LED to emit light based on the pixel voltage level.

In certain embodiments, the LED has a cathode and an anode, the cathode of the LED is connected to one of the inner feeding end and the outer feeding end of the corresponding first receiver antenna, and the pixel circuit includes: the pixel capacitor having a first electrode connected to the anode of the LED and a second electrode; an emission switch and a control switch electrically connected in series with the LED and the corresponding first receiver antenna, wherein a control end of the control switch is electrically connected to the second electrode of the pixel capacitor; a diode electrically connected to the second electrode of the pixel capacitor; a plurality of scan switches electrically connected in series with the corresponding second receiver antenna and the diode; and a reset switch electrically connected to the second electrode of the pixel capacitor, wherein: in the reset period, the reset switch is turned on, and the emission switch and at least one of the scan switches are turned off, such that the pixel capacitor is reset by the reset switch; in the data writing period, the scan switches are turned on, and the reset switch and the emission switch are turned off, such that the corresponding second receiver antenna, the scan switches and the diode form a first closed loop to provide the corresponding data signal to the pixel capacitor to charge the pixel capacitor to the pixel voltage level; and in the emission period, the emission switch is turned on, the reset switch and at least one of the scan switches are turned off, and the charged pixel capacitor of the pixel circuit turns on the control switch based on the pixel voltage level, such that the corresponding first receiver antenna, the emission switch, the control switch and the LED form a second closed loop to provide the corresponding power voltage to the LED to drive the LED to emit light.

In certain embodiments, each of the receiver antenna groups comprises a plurality of the second receiver antennas arranged in an matrix having I rows and J columns, wherein I and J are positive integers; in each of the receiver antenna groups, each of the I*J second receiver antennas corresponds to m columns and n rows of the pixels, wherein m and n are positive integers greater than 1, m<M, and n<N; and for each of two adjacent rows of the n rows of the pixels corresponding to each of the I*J second receiver antennas, the cathode of the LED of each of the pixels in one of the two adjacent rows is connected to the outer feeding end of the corresponding first receiver antenna, and the cathode of the LED of each of the pixels in the other of the two adjacent rows is connected to the inner feeding end of the corresponding first receiver antenna.

In certain embodiments, each of the first receiver antennas has an inner bridge structure electrically connected to the inner feeding end thereof and an outer bridge structure electrically connected to the outer feeding end thereof, and the inner bridge structure and the outer bridge structure are electrically insulated from each other; the inner bridge structure has a plurality of inner branch lines extending along a row direction, and the outer bridge structure has a plurality of outer branch lines extending along the row direction; and the inner branch lines and the outer branch lines are alternately disposed between the n rows of the pixels corresponding to each of the I*J second receiver antennas, such that the cathode of the LED of each of the pixels in one of the two adjacent rows is connected to the outer feeding end of the corresponding first receiver antenna through one of the outer branch lines of the outer bridge structure of the corresponding first receiver antenna, and the cathode of the LED of each of the pixels in the other of the two adjacent rows is connected to the inner feeding end of the corresponding first receiver antenna through one of the inner branch lines of the inner bridge structure of the corresponding first receiver antenna.

In certain embodiments, the scan switches includes a first scan switch electrically connecting the diode to one of the outer feeding end and the inner feeding end of the corresponding second receiver antenna, and a second scan switch electrically connected to the other of the outer feeding end and the inner feeding end of the corresponding second receiver antenna; and for each of two adjacent columns of the m columns of the pixels corresponding to each of the I*J second receiver antennas, the first scan switch of each of the pixels in one of the two adjacent columns is connected to the outer feeding end of the corresponding second receiver antenna, the second scan switch of each of the pixels in the one of the two adjacent columns is connected to the inner feeding end of the corresponding second receiver antenna, the first scan switch of each of the pixels in the other of the two adjacent columns is connected to the inner feeding end of the corresponding second receiver antenna, and the second scan switch of each of the pixels in the other of the two adjacent columns is connected to the outer feeding end of the corresponding second receiver antenna.

In certain embodiments, each of the second receiver antennas has an inner bridge structure electrically connected to the inner feeding end thereof and an outer bridge structure electrically connected to the outer feeding end thereof, and the inner bridge structure and the outer bridge structure are electrically insulated from each other; the inner bridge structure has a plurality of inner branch lines extending along a column direction, and the outer bridge structure has a plurality of outer branch lines extending along the column direction; and the inner branch lines and the outer branch lines are alternately disposed between the m columns of the pixels corresponding to each of the I*J second receiver antennas, such that the first scan switch of each of the pixels in one of the two adjacent columns is connected to the outer feeding end of the corresponding second receiver antenna through one of the outer branch lines of the outer bridge structure of the corresponding second receiver antenna, the second scan switch of each of the pixels in the one of the two adjacent columns is connected to the inner feeding end of the corresponding second receiver antenna through one of the inner branch lines of the inner bridge structure of the corresponding second receiver antenna, the first scan switch of each of the pixels in the other of the two adjacent columns is connected to the inner feeding end of the corresponding second receiver antenna through one of the inner branch lines of the inner bridge structure of the corresponding second receiver antenna, and the second scan switch of each of the pixels in the other of the two adjacent columns is connected to the outer feeding end of the corresponding second receiver antenna through one of the outer branch lines of the outer bridge structure of the corresponding second receiver antenna.

In certain embodiments, the corresponding power voltage provided by the corresponding first receiver antenna is a voltage difference between the inner feeding end and the outer feeding end of the corresponding first receiver antenna, the voltage difference is a sine wave, and a sum of the reset period and the data writing period is greater than or equal to one half of a period of the sine wave.

In another aspect of the disclosure, a tiled light-emitting diode (LED) display apparatus is provided, which includes a plurality of LED display panels arranged in tiles. Each of the LED display panels includes: a pixel structure corresponding to a display area, comprising a plurality of pixels arranged in an array having M columns and N rows, wherein M and N are positive integers; a receiver antenna structure disposed on the pixel structure, the receiver antenna structure comprising a plurality of first receiver antennas configured to provide power voltages to the pixels and a plurality of second receiver antennas configured to provide data signals to the pixels, wherein each of the first receiver antennas has a first resonance frequency, each of the second receiver antennas has a second resonance frequency greater than the first resonance frequency, and a first size of each of the first receiver antennas is greater than a second size of each of the second receiver antennas; wherein the first receiver antennas and the second receiver antennas form a plurality of receiver antenna groups, each of the receiver antenna groups comprises one of the first receiver antennas and at least one of the second receiver antennas being surrounded by the one of the first receiver antennas, and each of the second receiver antennas corresponds to at least one of the M columns and at least one of the N rows of the pixels.

A further aspect of the disclosure relates to a method of driving pixels of a display panel. In certain embodiments, the method includes: providing an active matrix display panel, including: a pixel structure corresponding to a display area, comprising a plurality of pixels arranged in a pixel array having M columns and N rows, wherein M and N are positive integers; and a receiver antenna structure disposed on the pixel structure, the receiver antenna structure comprising a plurality of first receiver antennas configured to provide power voltages to the pixels and a plurality of second receiver antennas configured to provide data signals to the pixels, wherein each of the first receiver antennas has a first resonance frequency, each of the second receiver antennas has a second resonance frequency greater than the first resonance frequency, and an inner diameter of each of the first receiver antennas is greater than an outer diameter of each of the second receiver antennas; wherein the first receiver antennas and the second receiver antennas form a plurality of receiver antenna groups, each of the receiver antenna groups comprises one of the first receiver antennas and at least one of the second receiver antennas being surrounded by the one of the first receiver antennas, and each of the second receiver antennas corresponds to at least one of the M columns and at least one of the N rows of the pixels; wherein each of the first receiver antennas and each of the second receiver antennas has an inner feeding end and an outer feeding end; wherein each of the pixels comprises a pixel circuit electrically connected to a corresponding first receiver antenna of the first receiver antennas and a corresponding second receiver antenna of the second receiver antennas, wherein the pixel circuit has a pixel capacitor; and a light emitting diode (LED) electrically connected to the corresponding first receiver antenna and the pixel circuit; in a reset period of each of the pixels, controlling, by the pixel circuit, the pixel capacitor to reset; in a data writing period of each of the pixels immediately after the reset period, controlling, by the pixel circuit, the corresponding second receiver antenna to provide a corresponding data signal to the pixel capacitor to charge the pixel capacitor to a pixel voltage level; and in an emission period of each of the pixels immediately after the data writing period, controlling, by the charged pixel capacitor of the pixel circuit, the corresponding first receiver antenna to provide a corresponding power voltage to the LED to drive the LED to emit light based on the pixel voltage level.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 2C schematically shows examples of the scan signals provided by the scan lines X1, X2, X3, Y1, Y2 and Y3 as shown in FIG. 2A according to certain embodiments of the present disclosure.

FIG. 4A schematically shows a receiver antenna structure and a transmitter antenna structure of an active matrix display panel according to certain embodiments of the present disclosure.

FIG. 5B schematically shows examples of the signals provided by the lines Xm, Yn-1, Yn and EMn as shown in FIG. 5A according to certain embodiments of the present disclosure.

FIG. 8 schematically shows a block diagram of a pixel circuit of a pixel according to yet another embodiment of the present disclosure.

FIG. 9D schematically shows the pixels in a 2*2 matrix electrically connected to the branch lines of the bridge structures as shown in FIGS. 9A and 9C according to certain embodiments of the present disclosure.

DETAILED DESCRIPTION OF THE DISCLOSURE

Figure 1A:
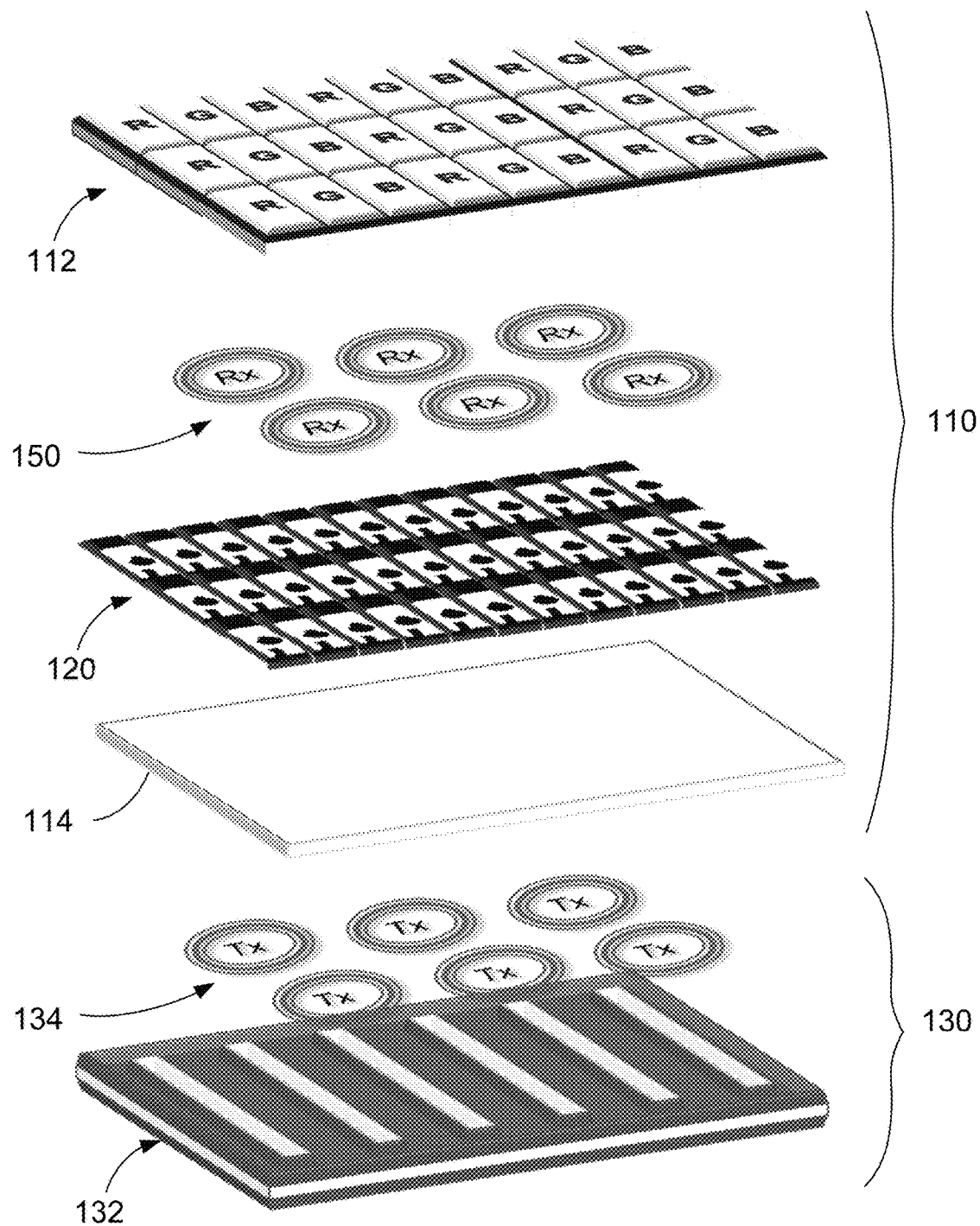
FIG. 1A schematically shows an exploded view of a display panel of a display device according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a wireless display panel with multi-channel data transmission and a display device using the same.

One aspect of the disclosure relates to a display panel, which uses light emitting diodes (LEDs) as an active matrix. For example, FIG. 1A schematically shows an exploded view of a display panel according to certain embodiments of the present disclosure. As shown in FIG. 1A, the display panel 100 is a color micro LED (μLED) display panel, which includes a display cell 110, a transmitter antenna structure 130, and a receiver antenna structure 150. The display cell 110 includes, from the image display side (top side of FIG. 1) toward a back side (bottom side of FIG. 1), a micro LED chip layer 112, a TFT array 120 and a glass substrate 114. The micro LED chip layer 112 includes multiple micro LED chips arranged in an array, where each micro LED chip may emit light in a corresponding RGB color (red, green and blue). Thus, the display cell 610 does not require a color filter layer, and the display panel 600 does not include a backlight module. The receiver antenna structure 150 is formed by a plurality of receiver antennas Rx and is disposed on the TFT array 120, and the receiver antenna structure 150 and the TFT array 120 are disposed on the glass substrate 114. The transmitter antenna structure 150 is formed by a transmitter antenna layer 154 disposed on a printed circuit board (PCB) 152, where the transmitter antenna layer 154 includes a plurality of transmitter antennas Tx 154 and the PCB 152 is spatially separated from the glass substrate 114, such that the transmitter antenna structure 130 as a whole is spatially separated from the receiver antenna structure 150. In other words, a distance exists between the transmitter antenna structure 130 and the receiver antenna structure 150 to facilitate high speed wireless data transmission between the transmitter antenna structure 130 and the receiver antenna structure 150. Each of the transmitter antennas Tx one-to-one corresponds to one of the receiver antennas Rx, and each of the transmitter antennas Tx has an identical resonance frequency to the resonance frequency of the corresponding receiver antenna Rx.

In the display cell 110, the TFT array 120 and the micro LED chip layer 112 correspondingly define a pixel structure, which corresponds to a display area of the display panel 100. Specifically, the pixel structure includes a plurality of pixels arranged in an array having M columns and N rows, where M and N are positive integers. For each pixel of the pixel structure, a corresponding TFT in the TFT array 120 and and a corresponding set of micro LED chips in the micro LED chip layer 112 are provided, where one TFT and one micro LED chip corresponds to one sub-pixel R, G or B of the pixel.

In certain embodiments, the display panel 100 may include other layers or structures not shown in FIG. 1A. For example, the TFT array 120 may include a plurality of signal lines, such as the data lines and gate lines. Further, multiple insulating films or layers may be provided in the pixel structure (i.e., the TFT array 120 and the micro LED chip layer 112). Moreover, since there is no backlight module between the TFT array 120 and the transmitter antenna structure 130, other layers or structures may exists between the TFT array 120 and the transmitter antenna structure 130 to prevent the TFT array 120 and the transmitter antenna structure 130 from directly contacting each other.

Figure 1B:
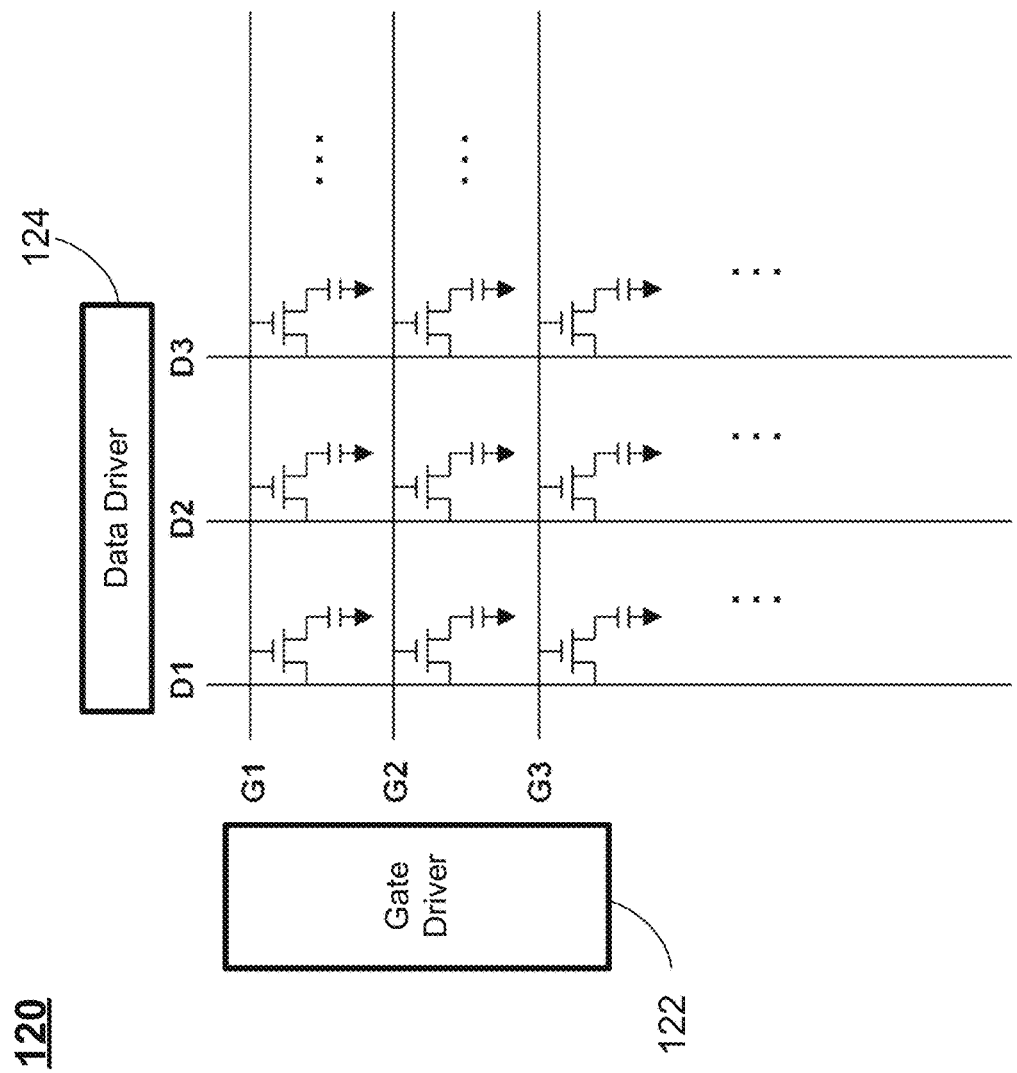
FIG. 1B schematically shows a part of a TFT array according to certain embodiments of the present disclosure.

FIG. 1B schematically shows a part of a TFT array according to certain embodiments of the present disclosure. As shown in FIG. 1B, the TFT array 120 includes a plurality of TFTs arranged in an array, where each of the TFT corresponds to a pixel of the pixel structure. In other words, for the pixel structure that includes a plurality of pixels arranged in an array having M columns and N rows, the TFT array 120 also includes a plurality of TFTs arranged in an array having M columns and N rows. Further, a plurality of data lines D1, D2, D3 . . . and a plurality of gate lines G1, G2, G3 . . . are provided in the pixel structure. Each of the data lines D1, D2, D3 is electrically connected to the sources of the TFTs in a corresponding column, and each of the gate lines G1, G2, G3 is electrically connected to the gates of the TFTs in a corresponding row. A gate driver 122 is connected to the gate lines G1, G2, G3 for providing gate signals to the gate lines, and a data driver 124 is connected to the data lines D1, D2, D3 for providing data signals to the data lines. In certain embodiments, the gate driver 122 and the data driver 124 are respectively provided at the border area of the display panel. In certain embodiments, multiple gate drivers 122 may be provided. In certain embodiments, multiple data drivers 124 may be provided.

Figure 2B:
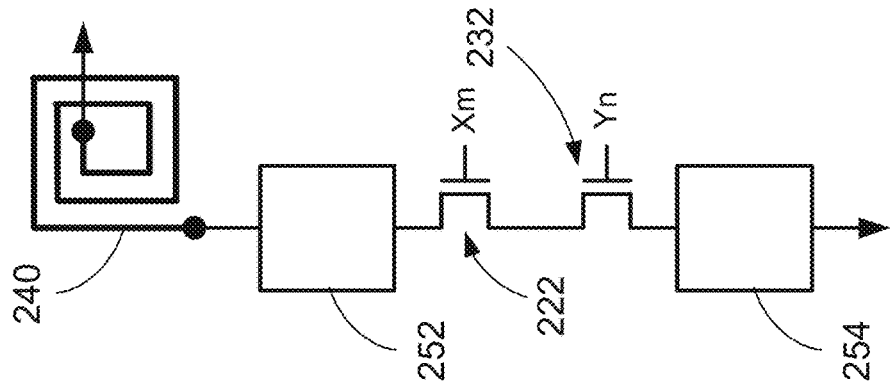
FIG. 2B schematically shows the connections between a receiver antenna, the pixel circuit of a pixel, and a plurality of scan transistor switches corresponding to the pixel according to certain embodiments of the present disclosure.
Figure 2A:
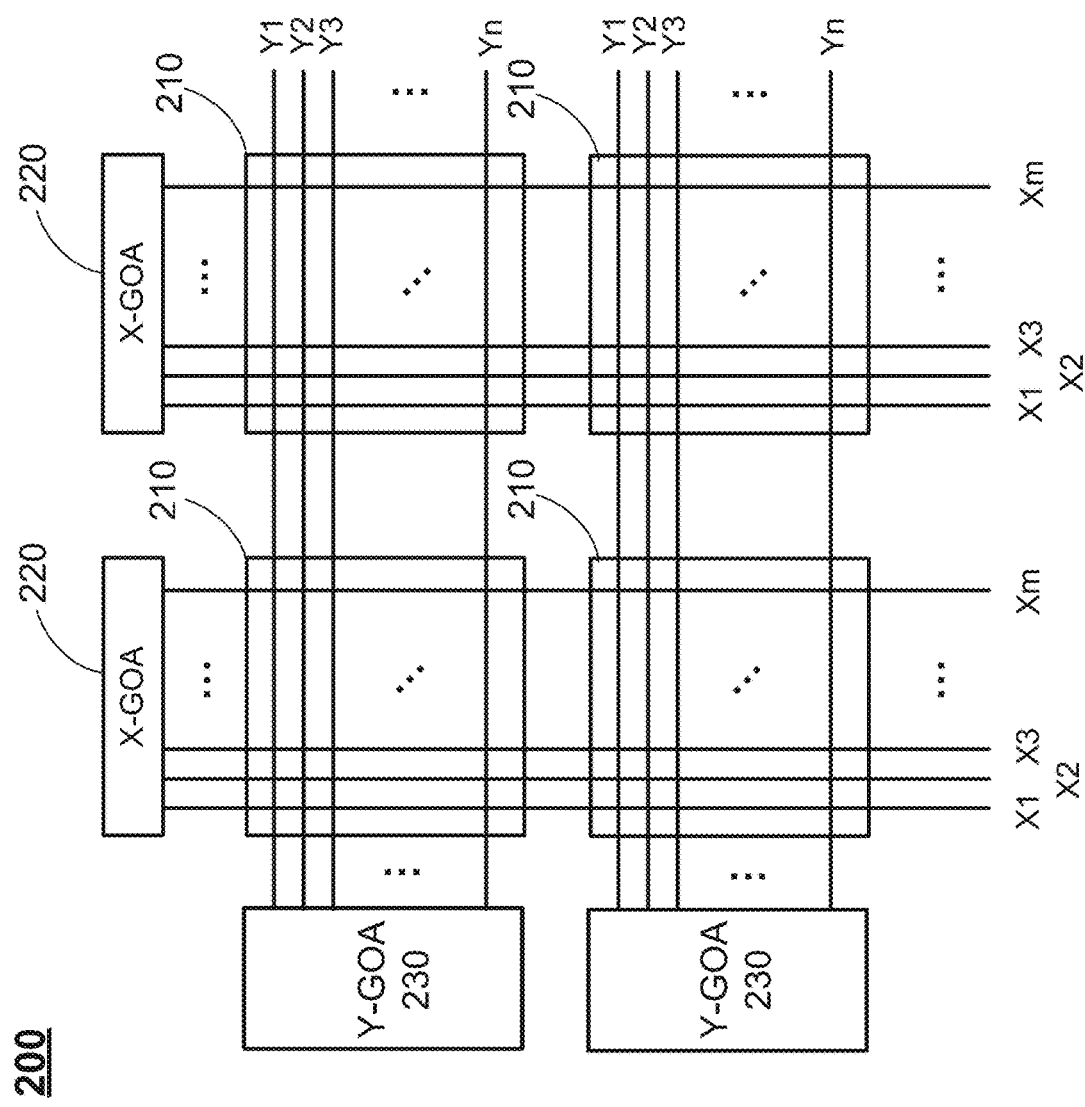
FIG. 2A schematically shows the connections between a matrix of receiver antenna groups in a receiver antenna structure and corresponding scan lines according to certain embodiments of the present disclosure.

FIG. 2A schematically shows the connections between a matrix of receiver antenna groups in a receiver antenna structure and corresponding scan lines according to certain embodiments of the present disclosure. As shown in FIG. 2A, the pixel structure 200 are divided into a plurality of receiver antenna groups 210, where each receiver antenna group 210 includes m*n pixels corresponding to a same receiver antenna (not shown in FIG. 2A) to transmit the data signal to the m*n pixels, where m and n are positive integers. Further, at a peripheral area of the pixel structure 200, multiple gate drivers on array (GOAs) 220 and 230 are respectively arranged in along the row direction and the column direction as shown in FIG. 2A. Specifically, each X-GOA 220 represents a GOA located at the top side of FIG. 2A, which is electrically connected to m scan lines X1, X2, X3, . . . Xm extending in the column direction (i.e. the X direction); and each Y-GOA 230 represents a GOA located at the left side of FIG. 2A, which is electrically connected to n scan lines Y1, Y2, Y3, . . . Yn extending in the row direction (in the Y direction). In this case, for each of the pixels corresponding to one of the receiver antenna groups 210, the pixel circuit of the pixel may include multiple scan transistors or switches, where at least one of the scan transistors is controlled by a scan signal transmitted through a corresponding one of the m scan lines X1, X2, X3, . . . Xm in the X direction, and at least one of the scan transistors is controlled by a scan signal transmitted through a corresponding one of the n scan lines Y1, Y2, Y3, . . . Yn in the Y direction, such that the pixel may be controlled by the scan signals to receive the data signal being transmitted by the corresponding receiver antenna.

FIG. 2B schematically shows the connections between a receiver antenna, the pixel circuit of a pixel, and a plurality of scan transistor switches corresponding to the pixel according to certain embodiments of the present disclosure. As shown in FIG. 2B, a receiver antenna 240 is electrically connected to a pixel circuit of the pixel, which includes a X scan transistor 222, a Y scan transistor 232, and two circuit modules 252 and 254 being in a series connection. Generally, a pixel circuit may include circuitry components such as transistors, capacitors, diodes or other circuits, and the connections between these circuitry components may vary. Thus, the two circuit modules 252 and 254 are merely shown as two blocks, without showing the detailed circuitry components of each of the circuit modules. Specifically, FIG. 2B shows that the X scan transistor 222 is connected to the scan line Xm, and the Y scan transistor 232 is electrically connected to the scan line Yn. In other words, the pixel as shown in FIG. 2B is a pixel that corresponds to the scan lines Xm and Yn as shown in FIG. 2A.

It should be noted that, although FIG. 2B shows the X scan transistor 222, the Y scan transistor 232, and two circuit modules 252 and 254 are in a series connection, the connections between the X scan transistor 222, the Y scan transistor 232, and two circuit modules 252 and 254 may also vary and are thus not limited thereto.

FIG. 2C schematically shows examples of the scan signals provided by the scan lines X1, X2, X3, Y1, Y2 and Y3 as shown in FIG. 2A according to certain embodiments of the present disclosure. As shown in FIG. 2C, each of the scan signals provided the scan lines X1, X2, X3, Y1, Y2 and Y3 are shown as a pulse wave signal with a corresponding fixed period and a fixed pulse beam width, and the pulse wave signal has a conduction period and a turn-off period. Specifically, the conduction period of each scan signal is indicated by a high level, and the turn-off period of each scan signal is indicated by a low level, but the disclosure is not limited thereto. As shown in FIG. 2C, at the period 280, the scan signals being transmitted by the scan lines X1 and Y1 are both in the corresponding conduction period, thus turning the corresponding scan transistors on, allowing the corresponding receiver antenna 240 to transmit the data signal to the pixel corresponding to the scan lines X1 and Y1. Similarly, at the period 290, the scan signals being transmitted by the scan lines X2 and Y2 are both in the corresponding conduction period, thus turning the corresponding scan transistors on, allowing the corresponding receiver antenna 240 to transmit the data signal to the pixel corresponding to the scan lines X2 and Y2.

Figure 3:
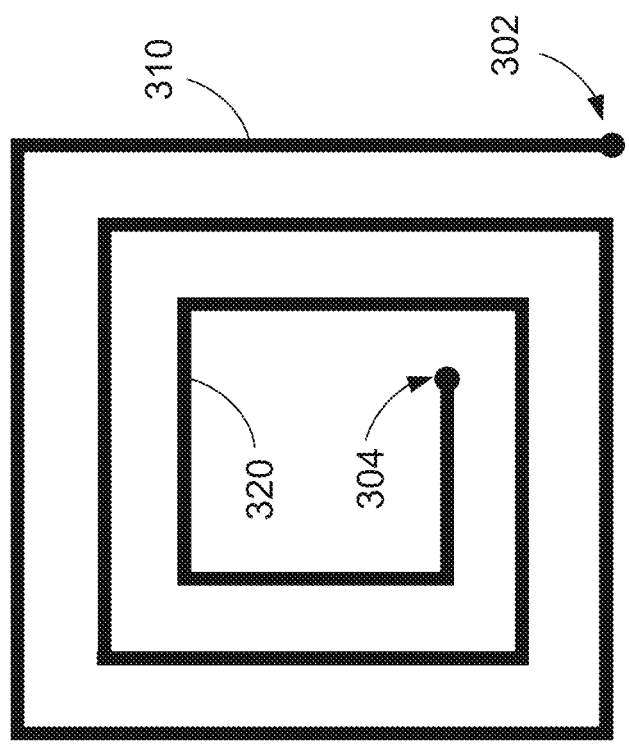
FIG. 3 schematically shows a top view of an antenna according to certain embodiments of the present disclosure.

FIG. 3 schematically shows an antenna according to certain embodiments of the disclosure. Specifically, the antenna 300 as shown in FIG. 3 can be used as a receiver antenna Rx in the receiver antenna structure 150 as shown in FIG. 1A. As shown in FIG. 3, the antenna 300 is winding from an outer feeding end 302 inward to an inner feeding end 304 in a counter-clockwise direction. In certain embodiments, the winding direction of the antenna 200 can be either clockwise or counter-clockwise. Further, and the antenna 300 includes a plurality of vertical segments 310 and horizontal segments 320, forming a plurality of turns of wires. As shown in FIG. 3, the winding number of the antenna 300 has a winding number N=3, indicating that the antenna 300 has three turns of wires. In certain embodiments, the winding number N of the antenna 300 may be determined based on the desired transmission characteristics of the antenna 300.

In certain embodiments, the transmission characteristics of an antenna may be described in the form of an induced decibel (dB), which reflects the transmission performance of the antenna. In the wireless transmission field, the value of the induced dB of an antenna indicates a ratio Rx/Tx, which refers to the ratio of the receiver antenna Rx to the transmitter antenna Tx of the antenna. For example, if a power ratio of the Rx/Tx is X, the amplitude ratio of the Rx/Tx is $(X)^{1/2}$, and the induced dB of the antenna is $10*\log_{10} X$. Generally, an antenna having an induced dB that is greater than −10 dB indicates an acceptable performance for the wireless transmission of the antenna, and an antenna having an induced dB that is close to 0 dB indicates an excellent performance (i.e., minimum transmission loss) for the wireless transmission of the antenna.

Referring back to FIG. 2B, the receiver antenna 240 is electrically connected to the pixel circuit of the pixel at its outer feeding end of the receiver antenna 240. In certain embodiments, the receiver antenna can be electrically connected to the corresponding data line at either one of the outer feeding end and the inner feeding end thereof. In this case, the other of the outer feeding end and the inner feeding end of the receiver antenna which is not being electrically connected to the corresponding data line may be grounded, or may be electrically connected to a reference voltage level (such as the common voltage $V_{COM}$ provided by a common electrode, or a $V_{SS}$ or $V_{DD}$ signal).

As stated above, in a wireless display panel, the wireless data transmission pairs Tx-Rx are generally used to transmit one type of signals, such as data signals. However, when multiple types of signals are required to be transmitted wirelessly, a new design of the transmitter and receiver antenna structures must be provided in order to provide multiple wireless data transmission pairs Tx-Rx having different resonance frequencies, such that the wireless data transmissions between the different wireless data transmission pairs Tx-Rx do not interfere with one another. Further, in a display panel using LEDs as the active matrix, such as the micro LED display panel, transmission of the power voltages generally requires a corresponding high current, which may increase the risks that the power lines being used to transmit the power voltages may be burned out due to the high current. Based on the needs as stated above, certain aspects of the present disclosure propose a feature that changes the structural arrangements of the receiver antennas Rx and the corresponding transmitter antennas Tx in order to allow transmissions of multiple signals, such as the data signals and the power voltages.

Figure 4B:
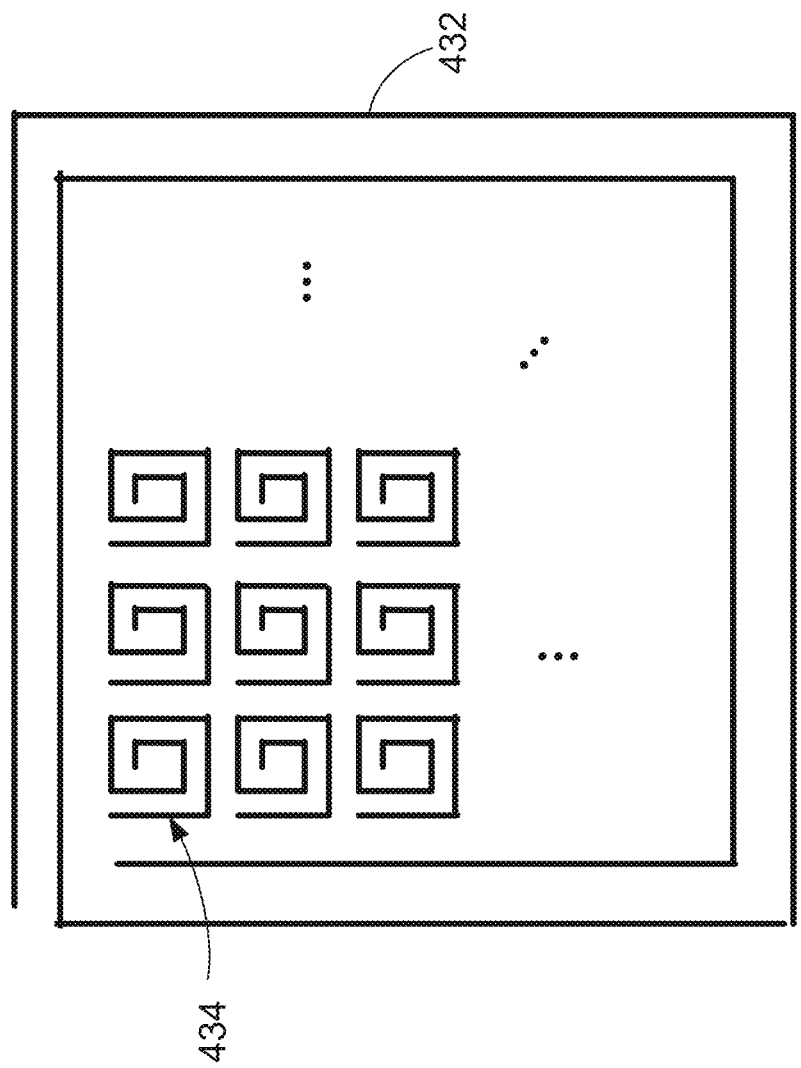
FIG. 4B schematically shows a receiver antenna group having a first receiver antenna and a plurality of second receiver antennas according to certain embodiments of the present disclosure.
Figure 4C:
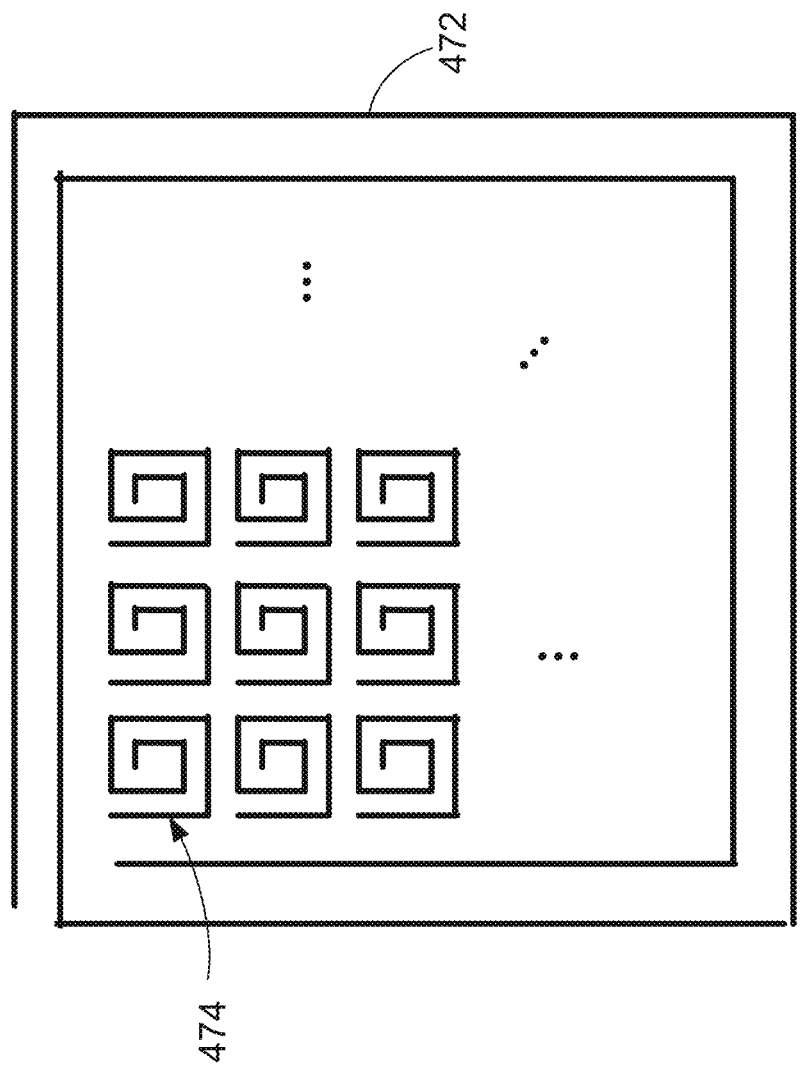
FIG. 4C schematically shows a transmitter antenna group having a first transmitter antenna and a plurality of second transmitter antennas according to certain embodiments of the present disclosure.

FIG. 4A schematically shows a receiver antenna structure and a transmitter antenna structure of an active matrix display panel according to certain embodiments of the present disclosure, FIG. 4B schematically shows a receiver antenna group having a first receiver antenna and a plurality of second receiver antennas according to certain embodiments of the present disclosure, and FIG. 4C schematically shows a transmitter antenna group having a first transmitter antenna and a plurality of second transmitter antennas according to certain embodiments of the present disclosure. As shown in FIG. 4A, the receiver antenna structure 410 includes a plurality of receiver antenna groups 430. Corresponding, the transmitter antenna structure 450 includes a plurality of transmitter antenna groups 470. As shown in FIG. 4B, each receiver antenna group 430 is formed by a first receiver antenna 432 and a plurality of second receiver antennas 434, where the second receiver antennas 434 are arranged in a matrix and are surrounded by the first receiver antenna 432. In certain embodiments, the second receiver antennas 434 in the receiver antenna group 430 are arranged in a matrix having I rows and J columns. In this case, the first receiver antenna 432 is used to provide power voltages to the corresponding pixels, and each of the second receiver antennas 434 is used to provide data signals to the corresponding pixels. In other words, for the corresponding pixels, each of the second receiver antennas 434 functions as the receiver antenna 240 as shown in FIG. 2B. Since the second receiver antennas 434 are surrounded by the first receiver antenna 432, the size of the first receiver antenna 434 is greater than the size of each of the second receiver antennas 434. In certain embodiments, the size of the first receiver antenna 432 can be 4 cm*4 cm, and the size of each of the second receiver antennas 434 can be 8 mm*10 mm. However, the sizes of the first and second receiver antennas 432 and 434 are not limited thereto. Further, the first receiver antenna 432 has a first resonance frequency $F_1$, and each of the second receiver antennas 434 has a second resonance frequency $F_2$. Since the first receiver antenna 432 is used to provide power voltages and the second receiver antennas 434 are used to provide data signals, the second resonance frequency $F_2$ is greater than the first resonance frequency $F_1$. In certain embodiments, the first resonance frequency can be in a range of 100 kHz to 1 MHz, and the second resonance frequency can be about 10 MHz.

As shown in FIG. 4C, each of the transmitter antenna groups 470 has a structure similar to the corresponding receiver antenna groups 430, such that the transmitter and receiver antennas may one-to-one correspondingly form the wireless data transmission pairs Tx-Rx. Specifically, each transmitter antenna group 470 is formed by a first transmitter antenna 472 and a plurality of second transmitter antennas 474, where the second transmitter antennas 474 are arranged in a matrix and are surrounded by the first transmitter antenna 472. The first transmitter antenna 472 one-to-one corresponds to the first receiver antenna 432 as shown in FIG. 4B, and has an identical first resonance frequency $F_1$. Similarly, each of the second transmitter antennas 474 one-to-one corresponds to one of the second receiver antennas 434 as shown in FIG. 4B, and has an identical second resonance frequency $F_2$.

Figure 4D:
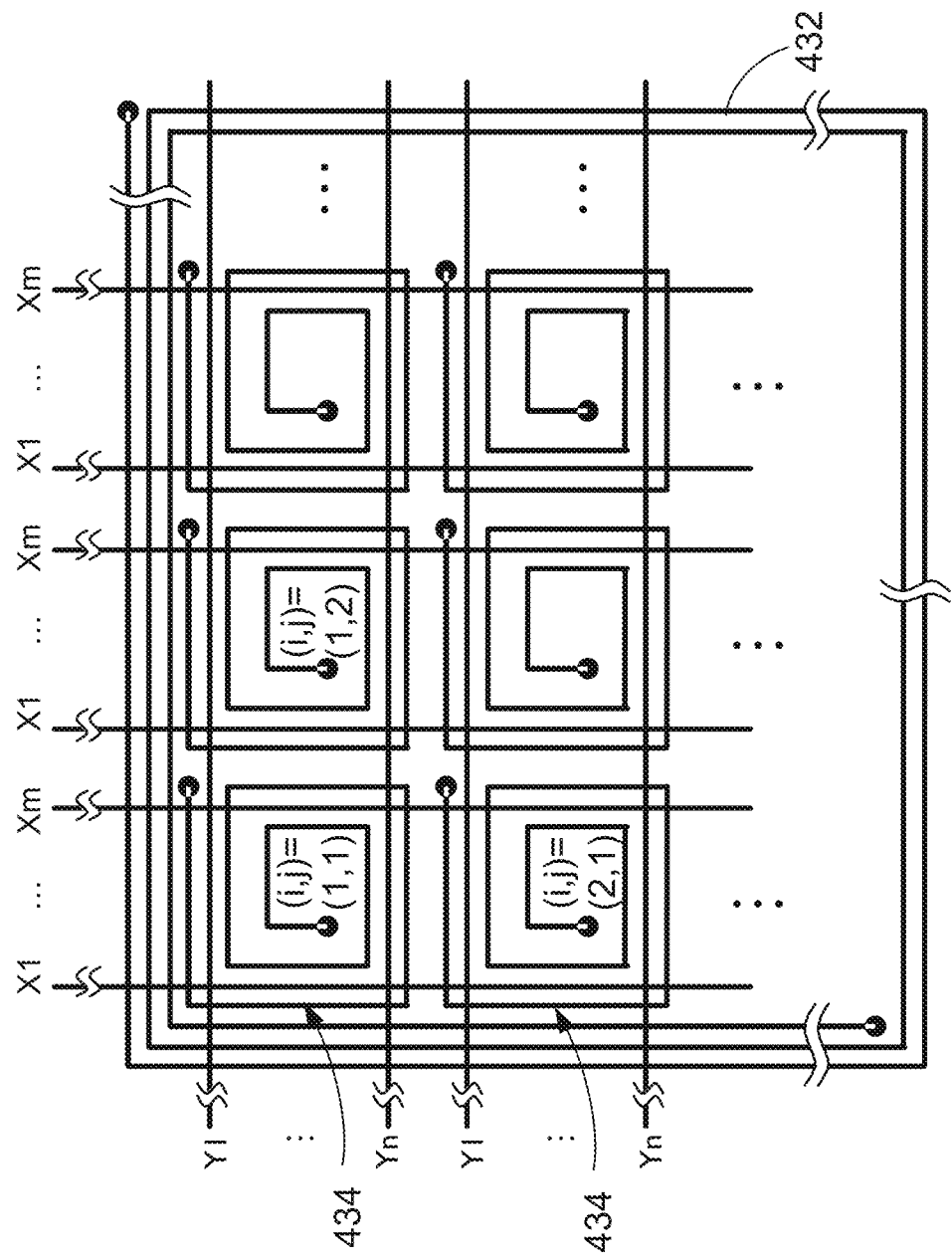
FIG. 4D schematically shows the connections between a receiver antenna group in the receiver antenna structure as shown in FIG. 4B and corresponding scan lines according to certain embodiments of the present disclosure.

FIG. 4D schematically shows the connections between a receiver antenna group in the receiver antenna structure as shown in FIG. 4B and corresponding scan lines according to certain embodiments of the present disclosure. As discussed above, each of the second receiver antennas 434 in a receiver antenna group 430 functions as the receiver antenna 240 as shown in FIG. 2B. Thus, each of the second receiver antennas 434 as shown in FIG. 4D corresponds to a group of X scan lines X1 to Xm in the X direction and a group of Y scan lines Y1 to Yn in the Y direction. Since the receiver antenna group 430 includes I*J second receiver antennas 434, and each second receiver antenna 434 corresponds to m*n pixels, each of the receiver antenna groups 430 may correspond to (I*J)*(m*n) pixels. In other words, the first receiver antenna 432, as the only first receiver antenna in the receiver antenna group 430, is used to provide power to the (I*J)*(m*n) pixels.

Figure 5A:
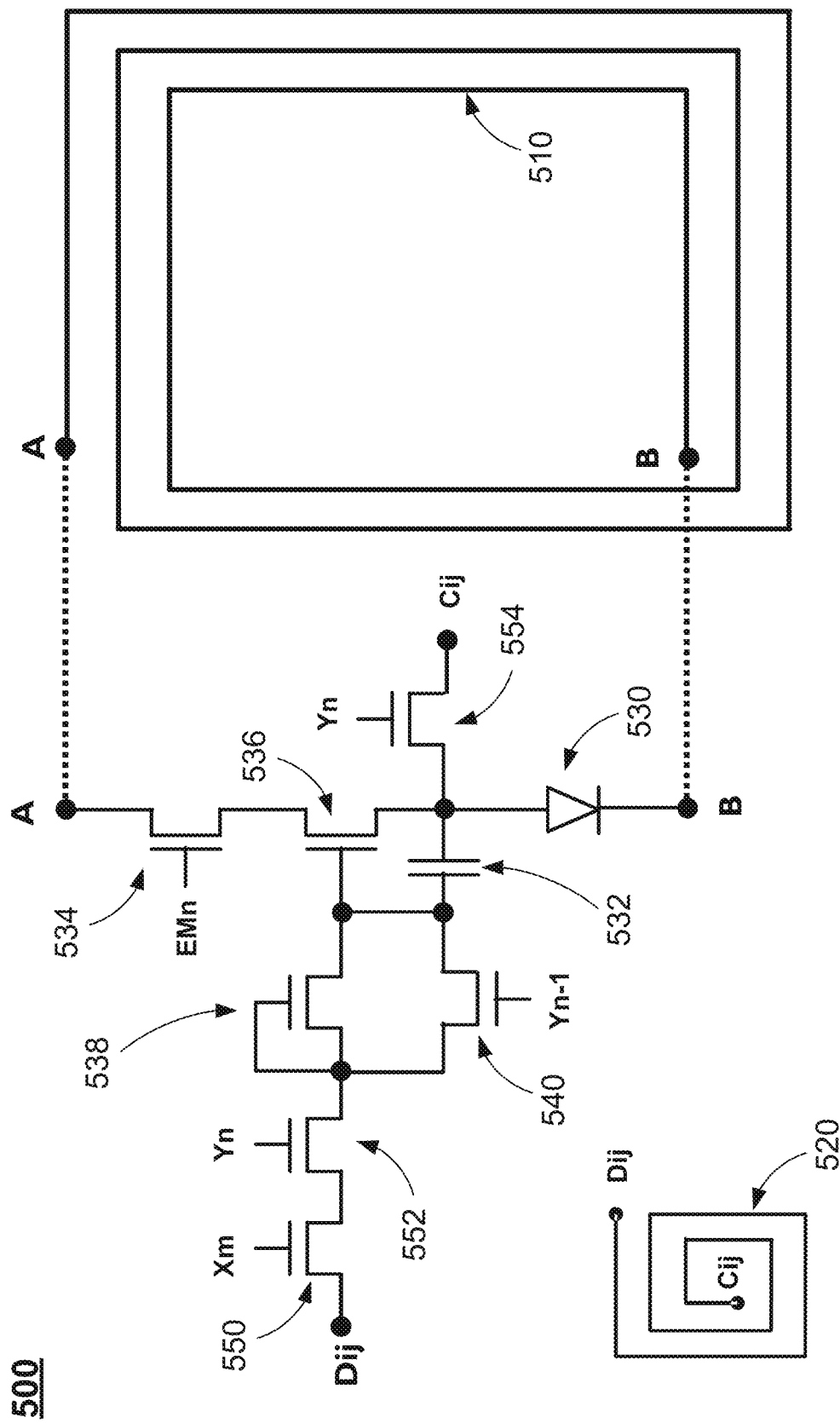
FIG. 5A schematically shows a pixel circuit of a pixel being connected to the corresponding first receiver antenna and the corresponding second receiver antenna according to certain embodiments of the present disclosure.

As discussed above, a pixel circuit may include circuitry components such as transistors (as switches), capacitors, diodes or other circuits, and the connections between these circuitry components may vary. For example, FIG. 5A schematically shows a pixel circuit of a pixel being connected to the corresponding first receiver antenna and the corresponding second receiver antenna according to certain embodiments of the present disclosure. As shown in FIG. 5A, the pixel circuit 500 is electrically connected to a corresponding first receiver antenna 510 and a corresponding second receiver antenna 520, and the pixel circuit 500 includes a LED 530, a pixel capacitor 532, an emission transistor 534, a control transistor 536, a diode 538, a reset transistor 540, and three scan transistors 550, 552 and 554. Specifically, the first receiver antenna 510 has an outer feeding end A and an inner feeding end B, where one of the outer feeding end A and the inner feeding end B functions as a power feeding end, and the other of the outer feeding end A and the inner feeding end B functions as a power reference end being provided with a power reference voltage (such as $V_{COM}$, $V_{SS}$ or $V_{DD}$). Similarly, the second receiver antenna 520 has an inner feeding end Cij and an outer feeding end Dij, where one of the inner feeding end Cij and the outer feeding end Dij functions as a data feeding end, and the other of the inner feeding end Cij and the outer feeding end Dij functions as data reference end being provided with a data reference voltage (such as $V_{COM}$, $V_{SS}$ or $V_{DD}$). The LED 530 has a cathode (the lower end thereof) and an anode (the upper end thereof), where the cathode of the LED 530 is electrically connected to the inner feeding end B of the first receiver antenna 510. The pixel capacitor 532 has two electrodes, where a first electrode of the pixel capacitor 532 (the right end thereof) is electrically connected to cathode of the LED 530, and a second electrode of the pixel capacitor 532 (the left end thereof) is electrically connected to the diode 538. The emission transistor 534 and the control transistor 536 are provided in a series connection, in order to electrically connect the outer feeding end A of the first receiver antenna 510 to the anode of the LED 530, where the control end of the emission transistor is electrically connected to an emission control signal EMn, and a control end of the control transistor 536 is electrically connected to the second electrode of the pixel capacitor 532. The diode 538 is provided between the scan transistor 552 and the second electrode of the pixel capacitor 532. The reset transistor 540 is provided to connect the two ends of the diode 538, where the control end of the reset transistor 540 is electrically connected to a corresponding Y scan line Yn−1. The first scan transistor 550 and the second scan transistor 552 are provided in a series connection, in order to electrically connect the outer feeding end Dij of the second receiver antenna 520 to the diode 538. The third scan transistor 554 is provided to electrically connect the inner feeding end Cij of the second receiver antenna 520 to the anode of the LED 530. The control end of the first scan transistor 550 is electrically connected to a corresponding X scan line Xm, and the control ends of the second scan transistor 552 and the third scan transistor 554 are respectively electrically connected to a corresponding Y scan line Yn.

As shown in FIG. 5A, the signals used to control the control ends of the transistors (including the emission transistor 534, the reset transistor 540, and the first, second and third transistors 550, 552 and 554) include EMn, Xm, Yn−1 and Yn. FIG. 5B schematically shows examples of the signals provided by the lines Xm, Yn−1, Yn and EMn as shown in FIG. 5A according to certain embodiments of the present disclosure, and FIGS. 5C, 5D and 5E respectively show a reset period, a data writing period and an emission period as shown in FIG. 5B.

Figure 5C:
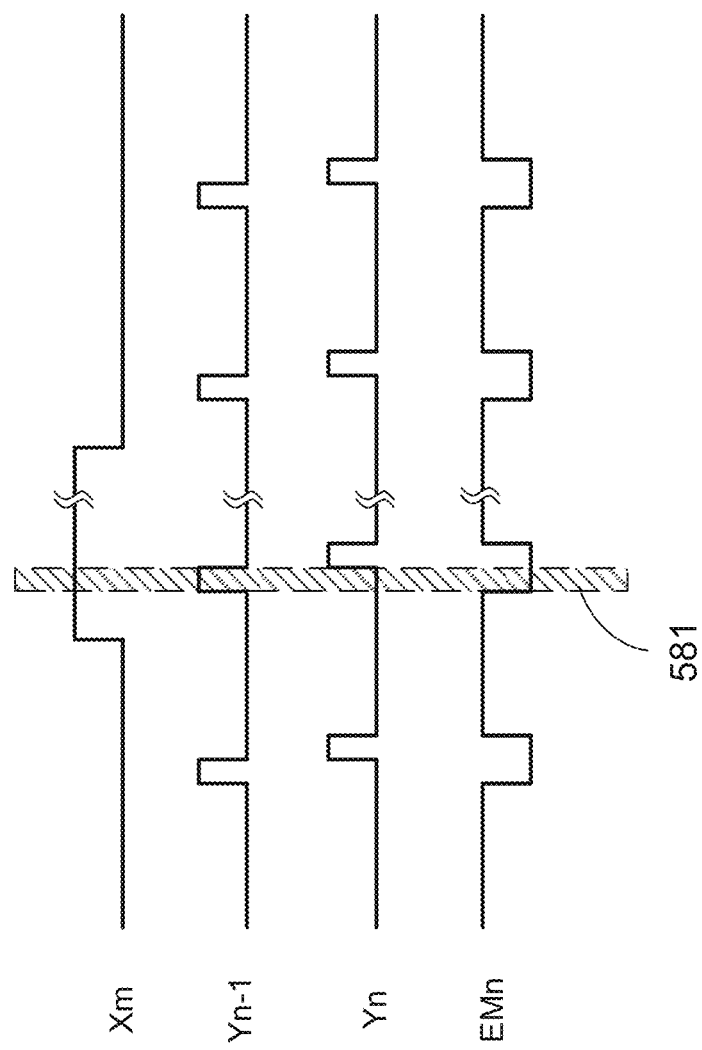
FIG. 5C schematically shows a reset period as shown in FIG. 5B according to certain embodiments of the present disclosure.

As shown in FIG. 5C, the conduction period of the scan signal Yn−1 corresponds to the reset period 581. In this case, the scan signal Yn−1 is at the high level, while the scan signal Yn and the emission control signal EMn are at the low level. Thus, the reset transistor 540 is turned on, while the second and third scan transistors 552 and 554 as well as the emission transistor 534 are turned off, such that the pixel voltage level stored in the pixel capacitor 532 for a previous frame of the pixel is discharged by the reset switch 540, thus resetting the pixel capacitor 532.

Figure 5D:
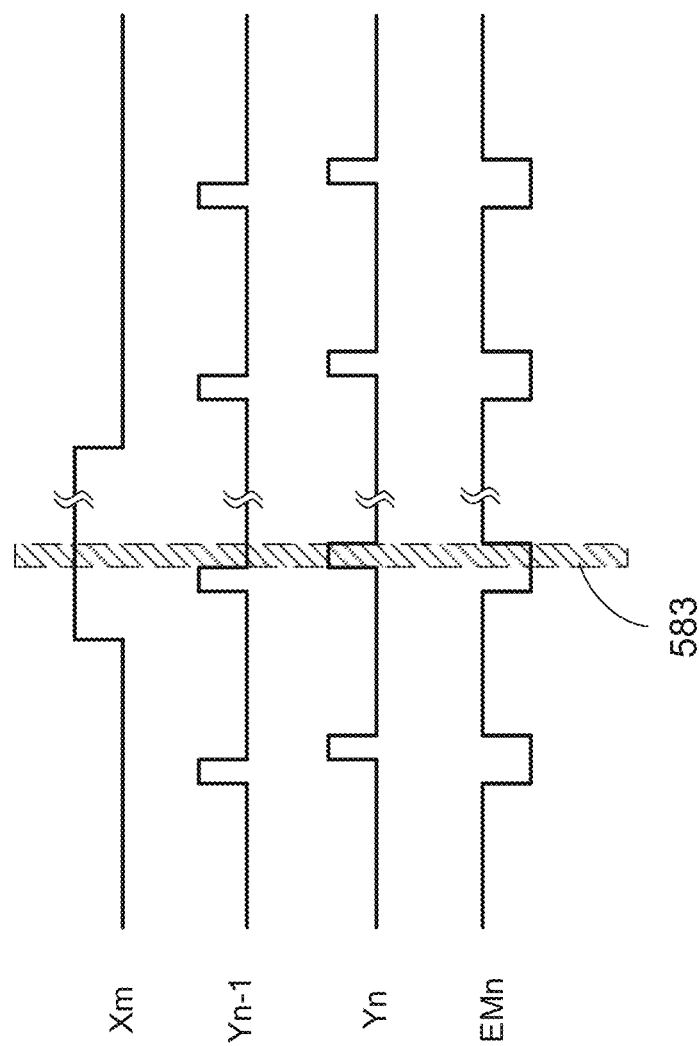
FIG. 5D schematically shows a data writing period as shown in FIG. 5B according to certain embodiments of the present disclosure.

As shown in FIG. 5D, the conduction period of the scan signal Yn corresponds to the data writing period 583, which is immediately after the reset period 581. In this case, the scan signals Xm and Yn are at the high level, while the scan signal Yn−1 and the emission control signal EMn are at the low level. Thus, the first, second and third transistors 552, 554 and 556 are turned on, while the reset transistor 540 as well as the emission transistor 534 are turned off, such that the corresponding second receiver antenna 520, the first scan transistor 550, the second scan transistor 552, the diode 538, the pixel capacitor 532 and the third scan transistor 554 form a first closed loop, enabling the second receiver antenna 520 to provide the corresponding data signal to the pixel capacitor 532 to charge the pixel capacitor 532 to the pixel voltage level for the current frame of the pixel.

Figure 5E:
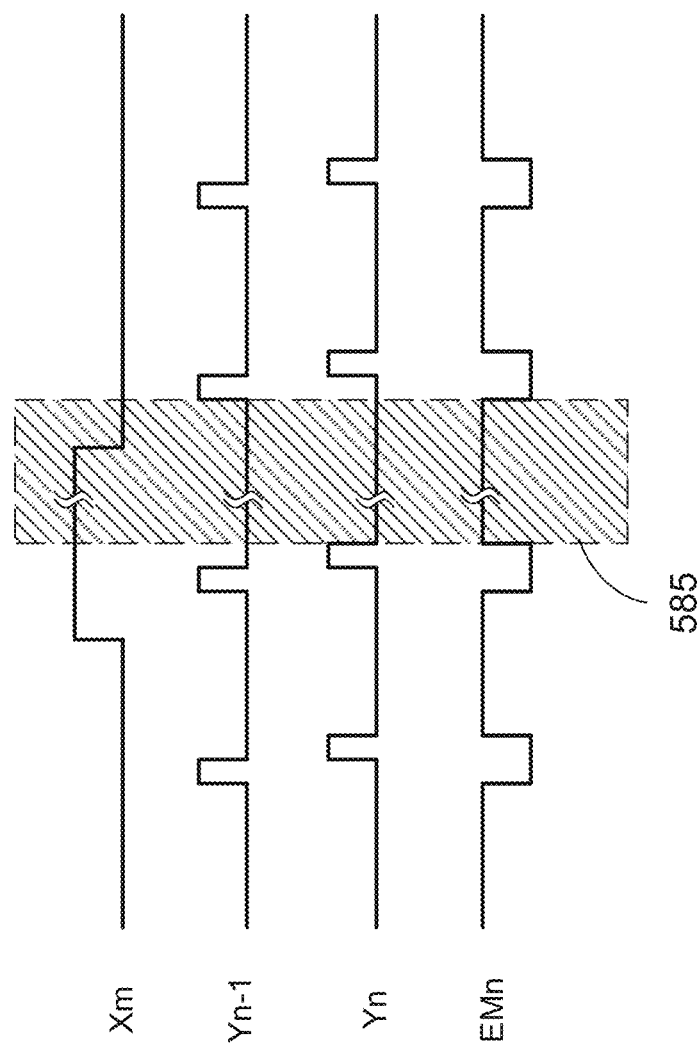
FIG. 5E schematically shows an emission period as shown in FIG. 5B according to certain embodiments of the present disclosure.

As shown in FIG. 5E, the conduction period of the emission control signal EMn corresponds to the emission period 585, which is immediately after the data writing period 583. In this case, the emission control signal EMn is at the high level, while the scan signals Yn and Yn−1 are at the low level. Thus, the emission transistor 534 is turned on, the reset transistor 540 as well as the second and third transistors 554 and 556 are turned off, and the pixel voltage level stored in the pixel capacitor 532 is used to turn on the control transistor 536 based on the pixel voltage level. Thus, the corresponding first receiver antenna 510, the emission transistor 534, the control transistor 536 and the LED 530 may form a second closed loop, enabling the first receiver antenna 510 to provide the corresponding power voltage to the LED 530 to drive the LED 530 to emit light.

A further aspect of the disclosure relates to a method of driving pixels of a display panel. In certain embodiments, the method may be applied to an active matrix display panel having the receiver antenna structure as described above, and each of the pixels may be provided with a pixel circuit 500 as shown in FIG. 5A. In certain embodiments, the method includes, for each of the pixels: in a reset period as shown in FIG. 5C, controlling, by the pixel circuit 500, the pixel capacitor 532 to reset; in a data writing period as shown in FIG. 5D, controlling, by the pixel circuit 500, the corresponding second receiver antenna 520 to provide a corresponding data signal to the pixel capacitor 532 to charge the pixel capacitor 532 to a pixel voltage level; and in an emission period as shown in FIG. 5E, controlling, by the charged pixel capacitor 532 of the pixel circuit 500, the corresponding first receiver antenna 510 to provide a corresponding power voltage to the LED 530 to drive the LED 530 to emit light based on the pixel voltage level.

In another embodiment, the pixel circuit may be implemented differently to facilitate the same data signal and power voltage transmissions as described above. For example, FIGS. 6A, 6B, 7A and 7B schematically show a plurality of pixel circuit according to different embodiments of the present disclosure.

Figure 6A:
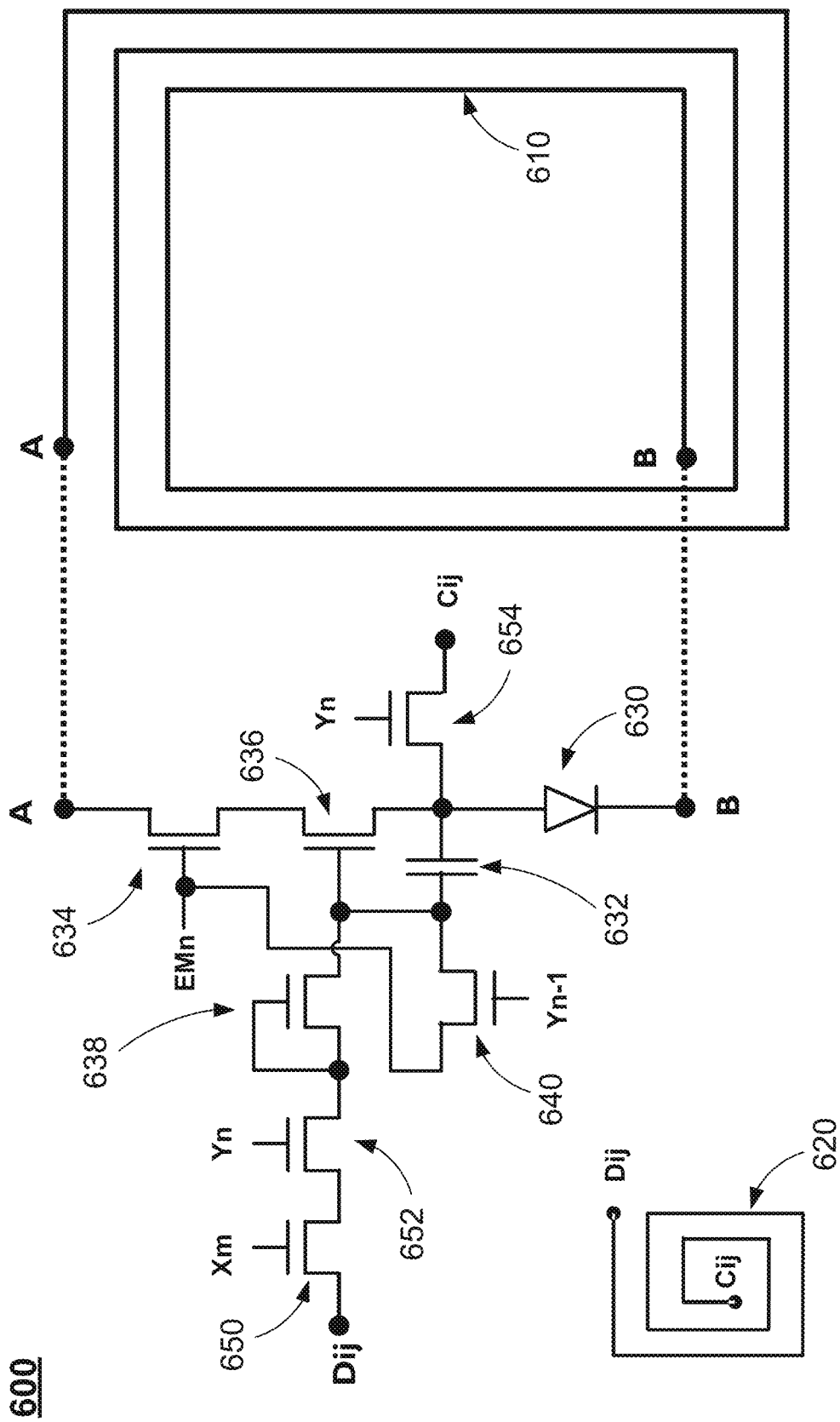
FIG. 6A schematically shows a pixel circuit of a pixel being connected to the corresponding first receiver antenna and the corresponding second receiver antenna according to another embodiment of the present disclosure.

As shown in FIG. 6A, the pixel circuit 600 is electrically connected to a corresponding first receiver antenna 610 and a corresponding second receiver antenna 620, and the pixel circuit 600 includes a LED 630, a pixel capacitor 632, an emission transistor 634, a control transistor 636, a diode 638, a reset transistor 640, and three scan transistors 650, 652 and 654. The only difference between the pixel circuit 600 and the pixel circuit 500 as shown in FIG. 5A exists in that the reset transistor 640 as shown in FIG. 6A is provided to connect the second electrode of the pixel capacitor 632 to the emission control signal EMn. In this case, in the reset period, the emission control signal EMn is at the low level, such that the pixel voltage level stored in the pixel capacitor 632 for a previous frame of the pixel may be discharged by the reset switch 640, thus resetting the pixel capacitor 632. All other circuitry components of the pixel circuit 600, including the LED 630, the pixel capacitor 632, the emission transistor 634, the control transistor 636, the diode 638, and the three scan transistors 650, 652 and 654, are identical to the LED 530, the pixel capacitor 532, the emission transistor 534, the control transistor 536, the diode 538 and the three scan transistors 550, 552 and 554 as shown in FIG. 5A, and are thus not elaborated herein.

Figure 6B:
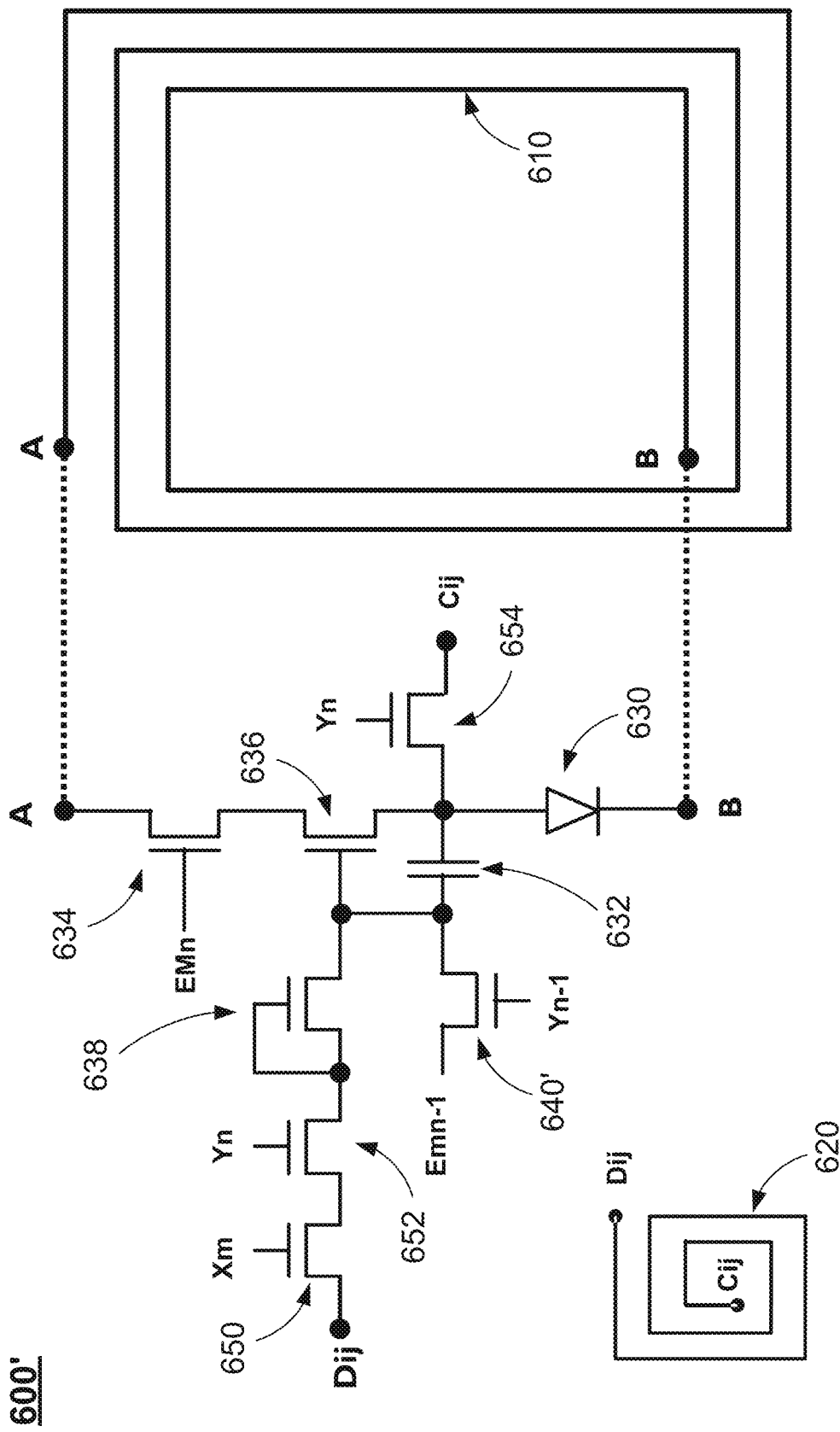
FIG. 6B schematically shows a pixel circuit of a pixel being connected to the corresponding first receiver antenna and the corresponding second receiver antenna according to a further embodiment of the present disclosure.
Figure 6C:
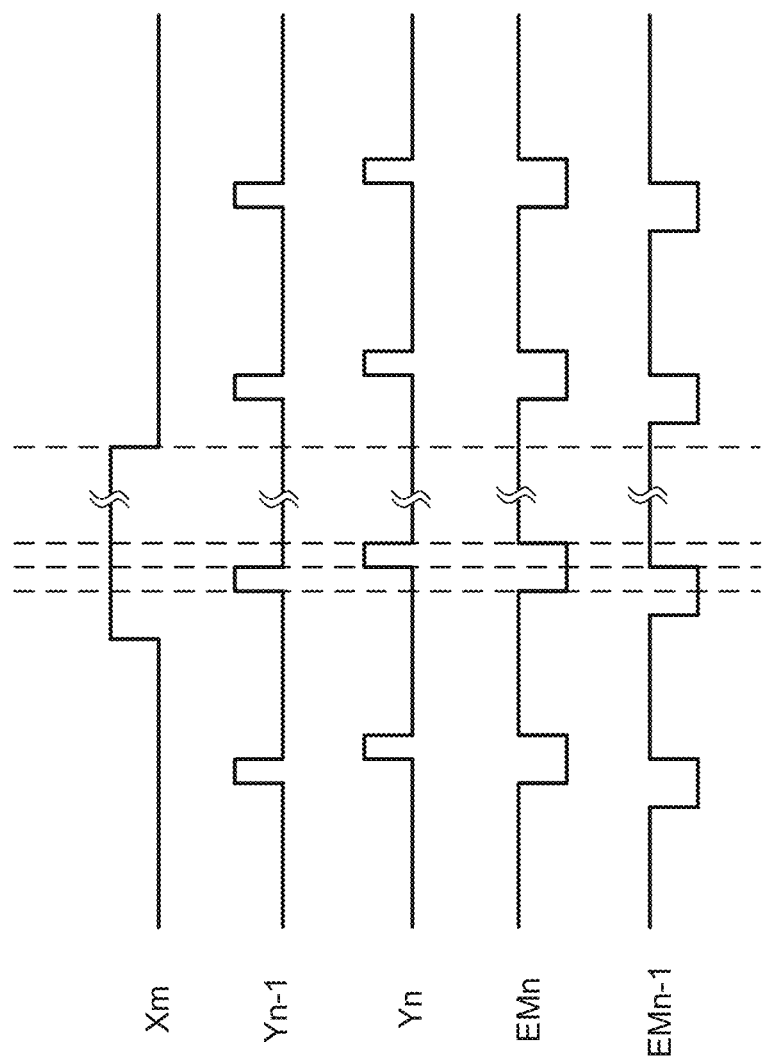
FIG. 6C schematically shows examples of the signals provided by the signals Xm, Yn−1, Yn, EMn and EMn−1 as shown in FIG. 6B according to certain embodiments of the present disclosure.

As shown in FIG. 6B, the pixel circuit 600' is electrically connected to a corresponding first receiver antenna 610 and a corresponding second receiver antenna 620, and the pixel circuit 600 includes a LED 630, a pixel capacitor 632, an emission transistor 634, a control transistor 636, a diode 638, a reset transistor 640', and three scan transistors 650, 652 and 654. The only difference between the pixel circuit 600' and the pixel circuit 600 as shown in FIG. 6A exists in that the reset transistor 640' as shown in FIG. 6B is provided to connect the second electrode of the pixel capacitor 632 to an emission control signal EMn−1. FIG. 6C schematically shows examples of the signals provided by the signals Xm, Yn−1, Yn, EMn and EMn−1 as shown in FIG. 6B according to certain embodiments of the present disclosure, where the signals Xm, Yn−1, Yn, and EMn are identical to the corresponding signals as shown in FIG. 5B. As shown in FIG. 6C, in the reset period, the emission control signal EMn is at the low level, such that the pixel voltage level stored in the pixel capacitor 632 for a previous frame of the pixel may be discharged by the reset switch 640', thus resetting the pixel capacitor 632. All other circuitry components of the pixel circuit 600, including the LED 630, the pixel capacitor 632, the emission transistor 634, the control transistor 636, the diode 638, and the three scan transistors 650, 652 and 654, are identical to the corresponding components with the identical reference numbers as shown in FIG. 6A, and are thus not elaborated herein.

Figure 7A:
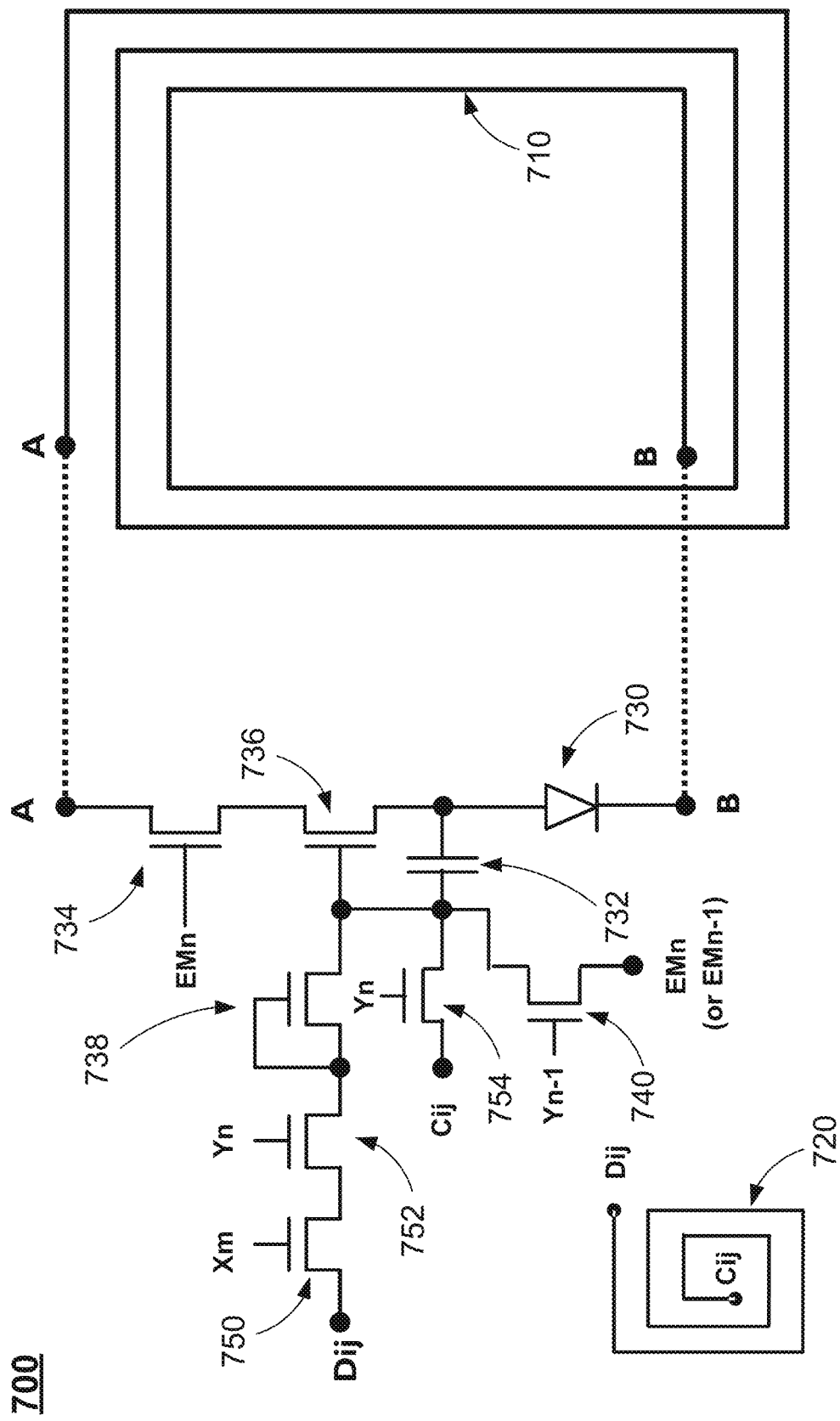
FIG. 7A schematically shows a pixel circuit of a pixel being connected to the corresponding first receiver antenna and the corresponding second receiver antenna according to yet another embodiment of the present disclosure.

As shown in FIG. 7A, the pixel circuit 700 is electrically connected to a corresponding first receiver antenna 710 and a corresponding second receiver antenna 720, and the pixel circuit 700 includes a LED 730, a pixel capacitor 732, an emission transistor 734, a control transistor 736, a diode 738, a reset transistor 740, and three scan transistors 750, 752 and 754. The only difference between the pixel circuit 700 and the pixel circuit 600 as shown in FIG. 6A exists in that the third scan transistor 754 as shown in FIG. 7A is provided to electrically connect the inner feeding end Cij of the second receiver antenna 520 to the second electrode of the pixel capacitor 732. In this case, in the data writing period, the corresponding second receiver antenna 720, the first scan transistor 750, the second scan transistor 752, the diode 738, the pixel capacitor 732 and the third scan transistor 754 form a first closed loop, enabling the second receiver antenna 720 to provide the corresponding data signal to the pixel capacitor 732 to charge the pixel capacitor 732 to the pixel voltage level for the current frame of the pixel. All other circuitry components of the pixel circuit 700, including the LED 730, the pixel capacitor 732, the emission transistor 734, the control transistor 736, the diode 738, the reset transistor 740, and the first and second scan transistors 750 and 752, are identical to the LED 630, the pixel capacitor 632, the emission transistor 634, the control transistor 636, the diode 638, the reset transistor 640, and the first and second scan transistors 650 and 652 as shown in FIG. 6A, and are thus not elaborated herein. In certain embodiments, the reset transistor 740 as shown in FIG. 7A may also be changed connect the second electrode of the pixel capacitor 732 to an emission control signal EMn−1, which is similar to the reset transistor 640' as shown in FIG. 6B.

Figure 7B:
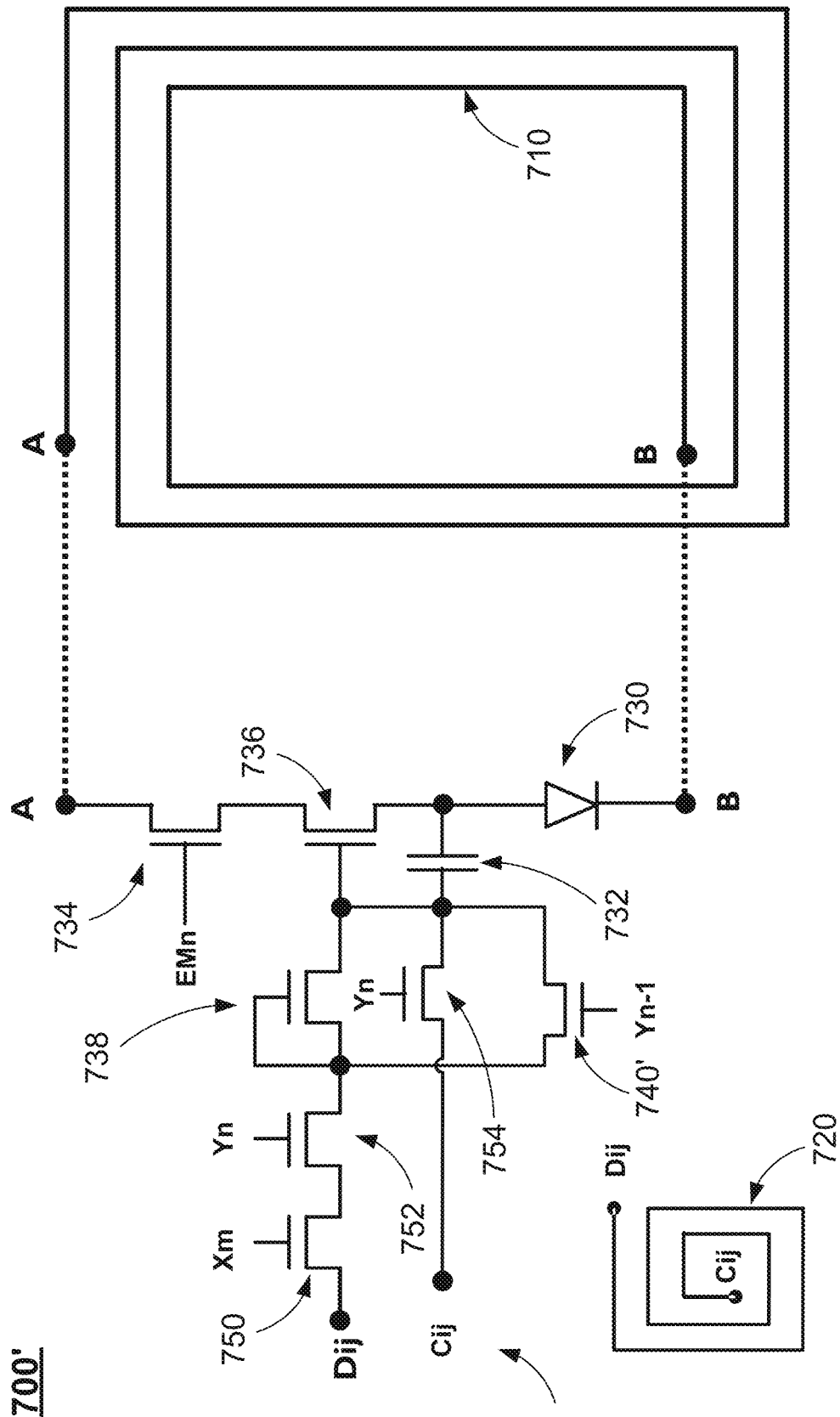
FIG. 7B schematically shows a pixel circuit of a pixel being connected to the corresponding first receiver antenna and the corresponding second receiver antenna according to yet a further embodiment of the present disclosure.

As shown in FIG. 7B, the pixel circuit 700' is electrically connected to a corresponding first receiver antenna 710 and a corresponding second receiver antenna 720, and the pixel circuit 700 includes a LED 730, a pixel capacitor 732, an emission transistor 734, a control transistor 736, a diode 738, a reset transistor 740', and three scan transistors 750, 752 and 754. The only difference between the pixel circuit 700' and the pixel circuit 500 as shown in FIG. 5A exists in that the reset transistor 740' as shown in FIG. 7B is provided to connect the two ends of the diode 738, which is similar to the reset transistor 540 as shown in FIG. 5A. All other circuitry components of the pixel circuit 700, including the LED 730, the pixel capacitor 732, the emission transistor 734, the control transistor 736, the diode 738, and the three scan transistors 750, 752 and 754, are identical to the corresponding components with the identical reference numbers as shown in FIG. 7A, and are thus not elaborated herein.

FIG. 8 schematically shows a block diagram of a pixel circuit of a pixel according to yet another embodiment of the present disclosure. As shown in FIG. 8, the pixel circuit 800 is formed by a circuit module 810 and an LED 830, where the circuit module 810 are respectively connected to the outer feeding end A of the first receiver antenna (not shown in FIG. 8) and the two feeding ends Cij and Dij of the second receiver antenna (not shown in FIG. 8), and the LED is connected to the inner feeding end B of the first receiver antenna (not shown in FIG. 8). Specifically, the detailed circuitries of the circuit module 810 may be implemented by the circuitries in any of the embodiments as described above and as shown in FIGS. 5A, 6A, 6B, 7A and 7B, and is thus not limited thereto.

Figure 9A:
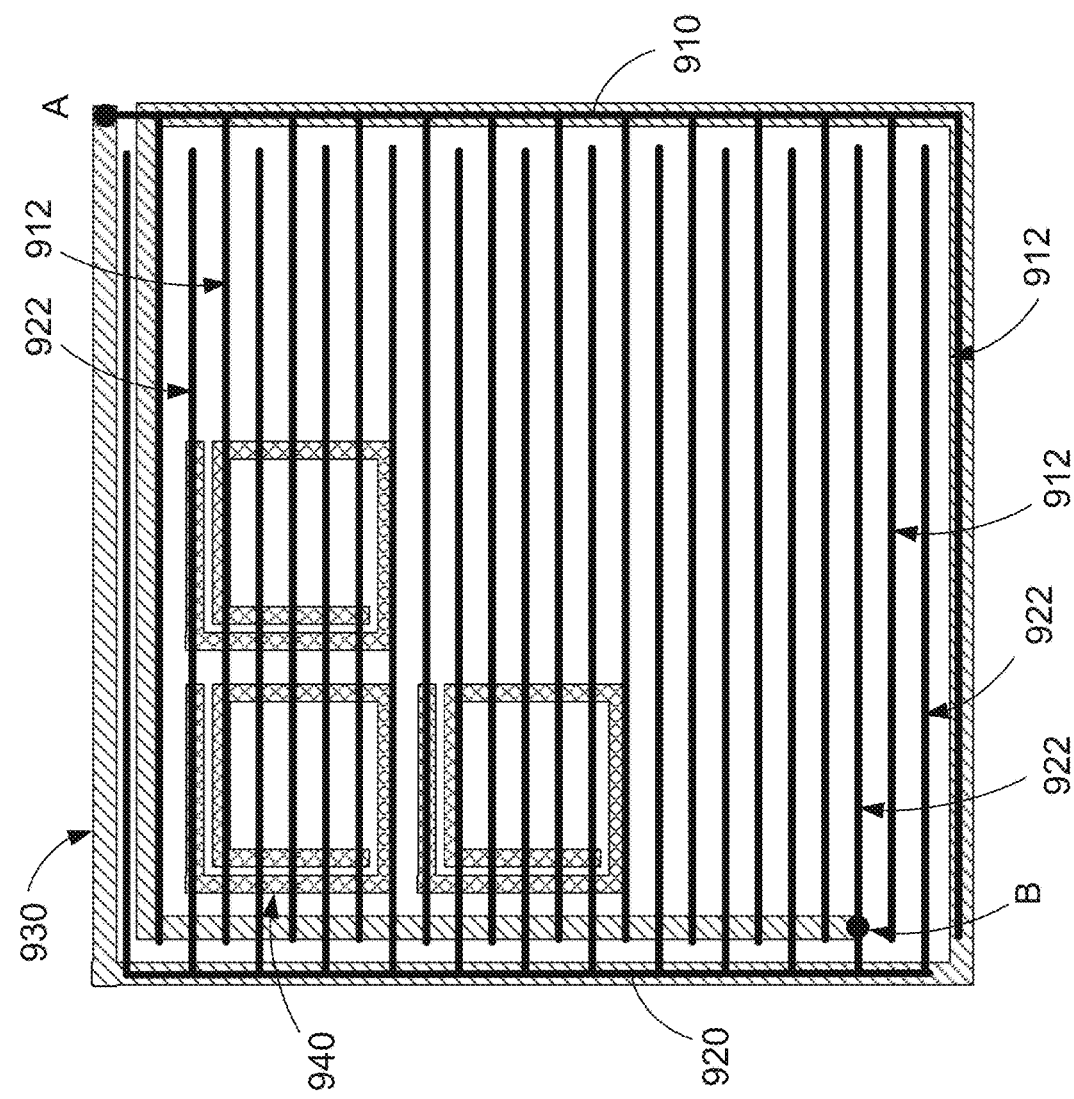
FIG. 9A schematically shows the bridge structures electrically connected to the inner feeding end and the outer feeding end of the first receiver antenna according to certain embodiments of the present disclosure.
Figure 9B:
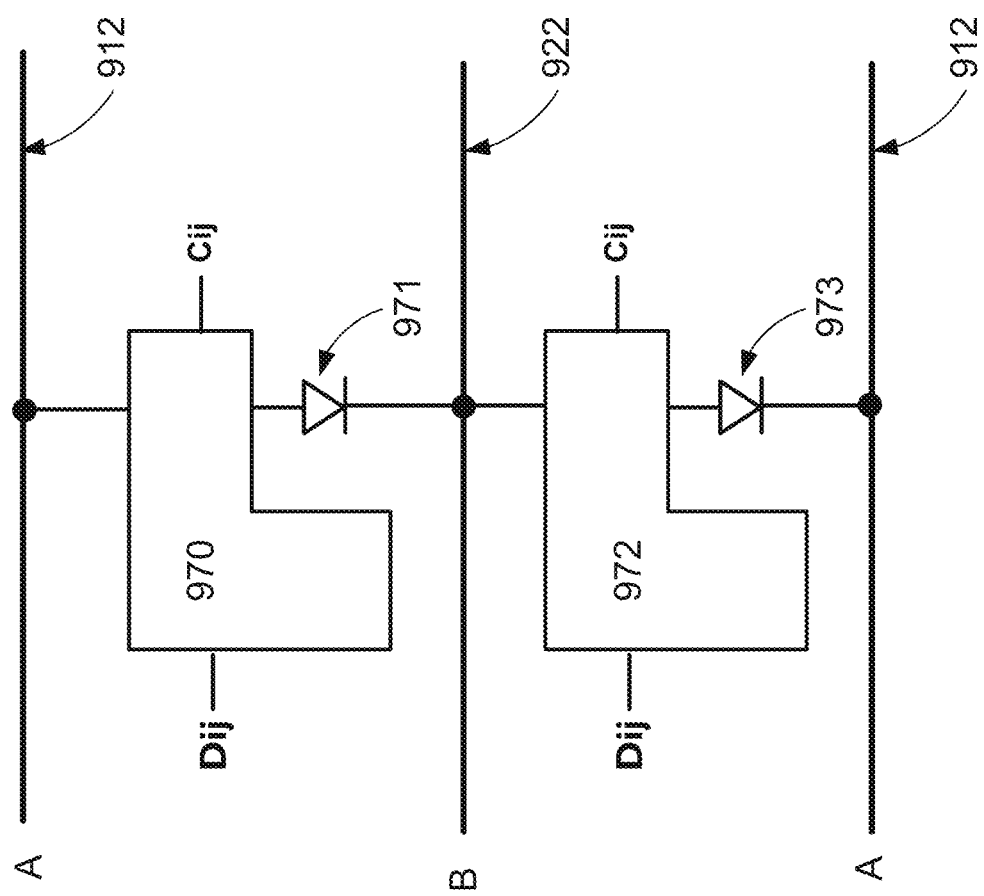
FIG. 9B schematically shows the pixels in two adjacent rows electrically connected to the branch lines of the bridge structures as shown in FIG. 9A according to certain embodiments of the present disclosure.

FIG. 9A schematically shows the bridge structures electrically connected to the inner feeding end and the outer feeding end of the first receiver antenna according to certain embodiments of the present disclosure, and FIG. 9B schematically shows the pixels in two adjacent rows electrically connected to the branch lines of the bridge structures as shown in FIG. 9A according to certain embodiments of the present disclosure. As shown in FIG. 9A, the receiver antenna group 900 includes a first receiver antenna 930 and a plurality of second receiver antennas 940. Specifically, the first receiver antenna 930 is provided with two bridge structures, including an outer bridge structure electrically connected to the outer feeding end A of the first receiver antenna 930 and an inner bridge structure electrically connected to the inner feeding end B of the first receiver antenna 930. The outer bridge structure is a comb-shape structure having an outer main line 910 and a plurality of outer branch lines 912 extending along the row direction toward left. The inner bridge structure is a comb-shape structure having an inner main line 920 and a plurality of inner branch lines 922 extending along the row direction toward right. The outer branch lines 912 and the inner branch lines 922 are alternately disposed between the rows of the pixels. It should be noted that the outer bridge structure and the inner bridge structure are not in contact with each other, such that no closed loop is formed by the first receiver antenna 930 and the two bridge structures.

As shown in FIG. 9B, for two pixels 970 and 972 in two adjacent rows, the cathode of the LED 971 of the pixel 970 is connected to the inner feeding end B of the first receiver antenna 930 through a corresponding inner branch line 922, and the cathode of the LED 973 of the pixel 972 is connected to the outer feeding end A of the first receiver antenna 930 through a corresponding outer branch line 912. In this case, the connections of the first receiver antenna 930 with the pixels 970 and 972 in the two adjacent rows may be arranged differently.

Figure 9C:
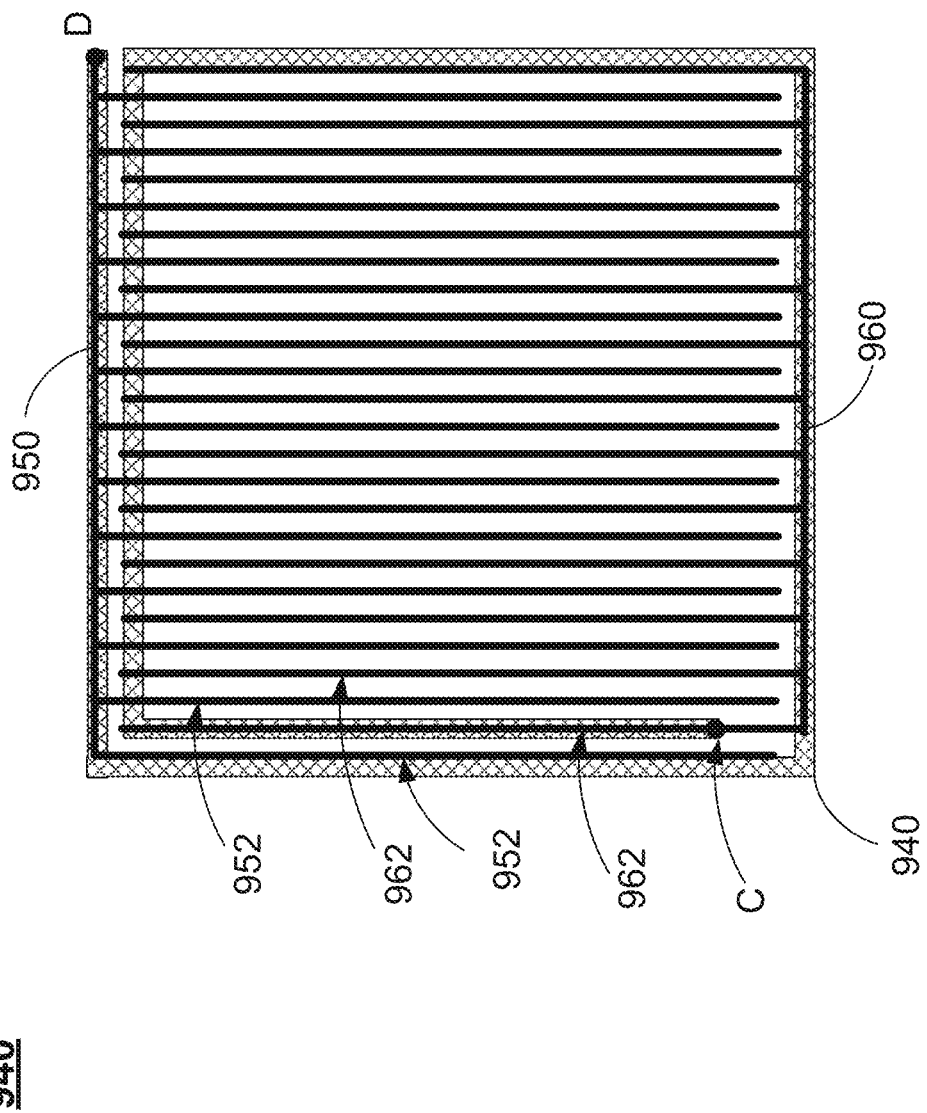
FIG. 9C schematically shows the bridge structures electrically connected to the inner feeding end and the outer feeding end of the second receiver antenna according to certain embodiments of the present disclosure.

Similarly, each of the first receiver antenna 940 may also be provided with two corresponding bridge structures. FIG. 9C schematically shows the bridge structures electrically connected to the inner feeding end and the outer feeding end of the second receiver antenna according to certain embodiments of the present disclosure. T As shown in FIG. 9C, the second receiver antenna 940 is provided with two bridge structures, including an outer bridge structure electrically connected to the outer feeding end D of the second receiver antenna 940 and an inner bridge structure electrically connected to the inner feeding end C of the second receiver antenna 940. The outer bridge structure is a comb-shape structure having an outer main line 950 and a plurality of outer branch lines 952 extending along the column direction toward the bottom of FIG. 9C. The inner bridge structure is a comb-shape structure having an inner main line 960 and a plurality of inner branch lines 962 extending along the column direction toward the top of FIG. 9C. The outer branch lines 952 and the inner branch lines 962 are alternately disposed between the columns of the pixels. It should be noted that the outer bridge structure and the inner bridge structure are not in contact with each other, such that no closed loop is formed by the second receiver antenna 940 and the two bridge structures.

FIG. 9D schematically shows the pixels in a 2*2 matrix electrically connected to the branch lines of the bridge structures as shown in FIGS. 9A and 9C according to certain embodiments of the present disclosure. As shown in FIG. 9B, four pixels 970, 972, 980 and 982 are provided in a 2*2 matrix. The connections of the first receiver antenna 930 with the pixels 970 and 972 in the two adjacent rows are arranged differently, as described above with reference to FIG. 9B, and are thus not elaborated herein. For the two pixels 970 and 974 in the two adjacent columns, the pixel 970 includes two scan transistors 974 and 976 located at two sides of its pixel circuit, and the pixel 980 includes two scan transistors 984 and 986 located at two sides of its pixel circuit. The first scan transistor 974 of the pixel 970 is connected to the inner feeding end C of the corresponding second receiver antenna 940 through a corresponding inner branch line 962, and the second scan transistor 976 of the pixel 970 is connected to the outer feeding end D of the corresponding second receiver antenna 940 through a corresponding outer branch line 952. On the other hand, the first scan transistor 984 of the pixel 980 is connected to the outer feeding end D of the corresponding second receiver antenna 940 through a corresponding outer branch line 952, and the second scan transistor 986 of the pixel 980 is connected to the inner feeding end C of the corresponding second receiver antenna 940 through a corresponding inner branch line 962. In this case, the connections of the second receiver antenna 940 with the pixels 970 and 980 in the two adjacent columns may be arranged differently.

As shown in FIGS. 9A and 9B, the connections of the first receiver antenna 930 with the pixels 970 and 972 in the two adjacent rows may be arranged differently. The reason behind such configuration is due to the fact that the corresponding power voltage provided by the first receiver antenna 930 is a voltage difference between the outer feeding end A and the inner feeding end B of the first receiver antenna B, and the voltage difference is in the form of a sine wave. Using the pixel 970 as shown in FIG. 9B as an example, when $V_A>V_B$, the LED 971 will emit light, and when $V_A<V_B$, the LED 971 does not emit light. In other words, the LED 971 will emit light when $\Delta V$ (A-B)=$V_A$-$V_B$>0. On the other hand, for the pixel 972 as shown in FIG. 9B, which is connected to the two feeding ends of the first receiver antenna 930 different from the pixel 970, when $V_A>V_B$, the LED 973 does not emit light, and when $V_A<V_B$, the LED 973 will emit light. In other words, the LED 973 will emit light when $\Delta V$ (A-B)=$V_A$-$V_B$<0.

Figure 10:
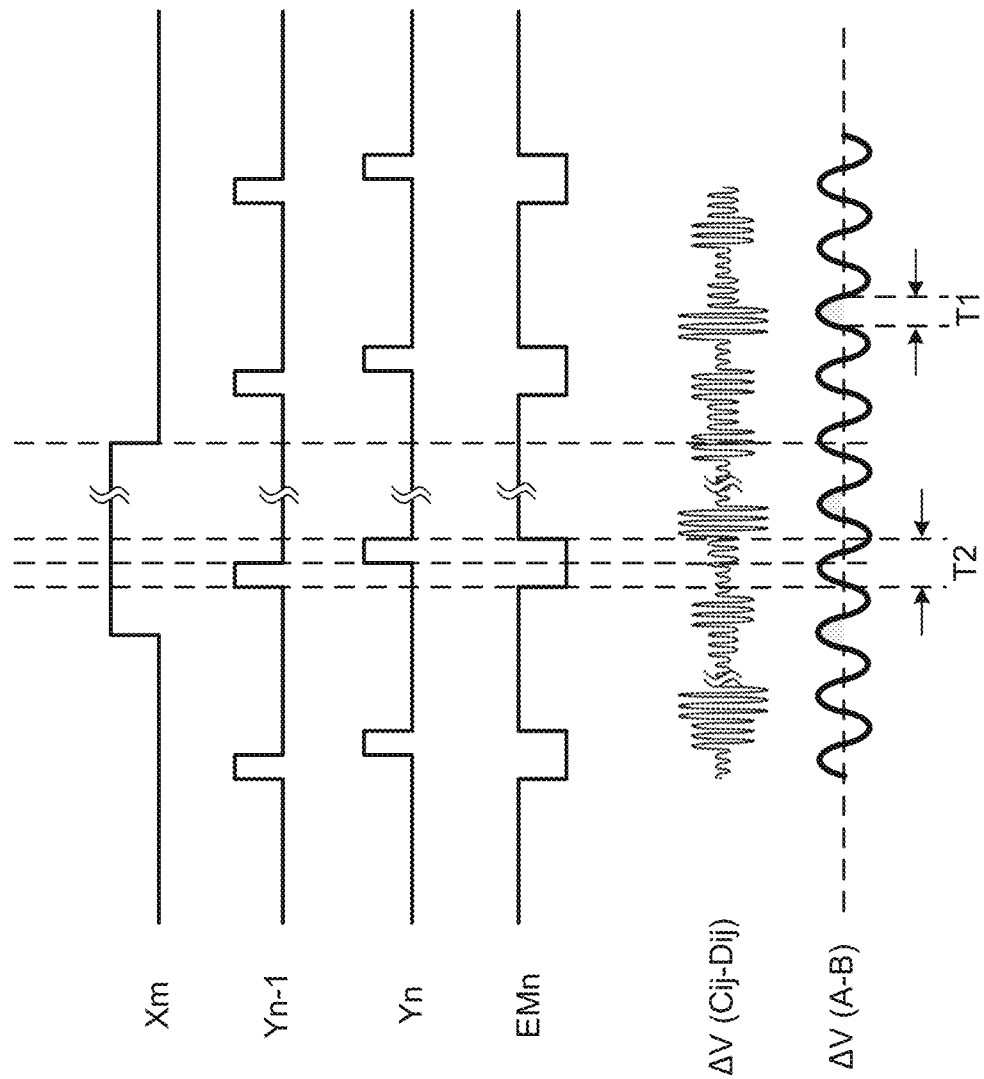
FIG. 10 schematically shows examples of the signals provided by the lines Xm, Yn−1, Yn and EMn and the voltage difference provided by the first receiver antenna and the second receiver antenna according to certain embodiments of the present disclosure.

FIG. 10 schematically shows examples of the signals provided by the lines Xm, Yn-1, Yn and EMn and the voltage difference provided by the first receiver antenna and the second receiver antenna according to certain embodiments of the present disclosure. As shown in FIG. 10, for each of the pixels, the corresponding LED will emit light when $\Delta V$ (A-B)=$V_A$-$V_B$ is either greater than 0 or less than 0. Thus, as long as an emission pulse width T2 (which is a sum of the reset period and the data writing period) is greater than or equal to one half of a period of the sine wave T1, the total emission time in the emission period will remain the same for all of the pixels.

Figure 11:
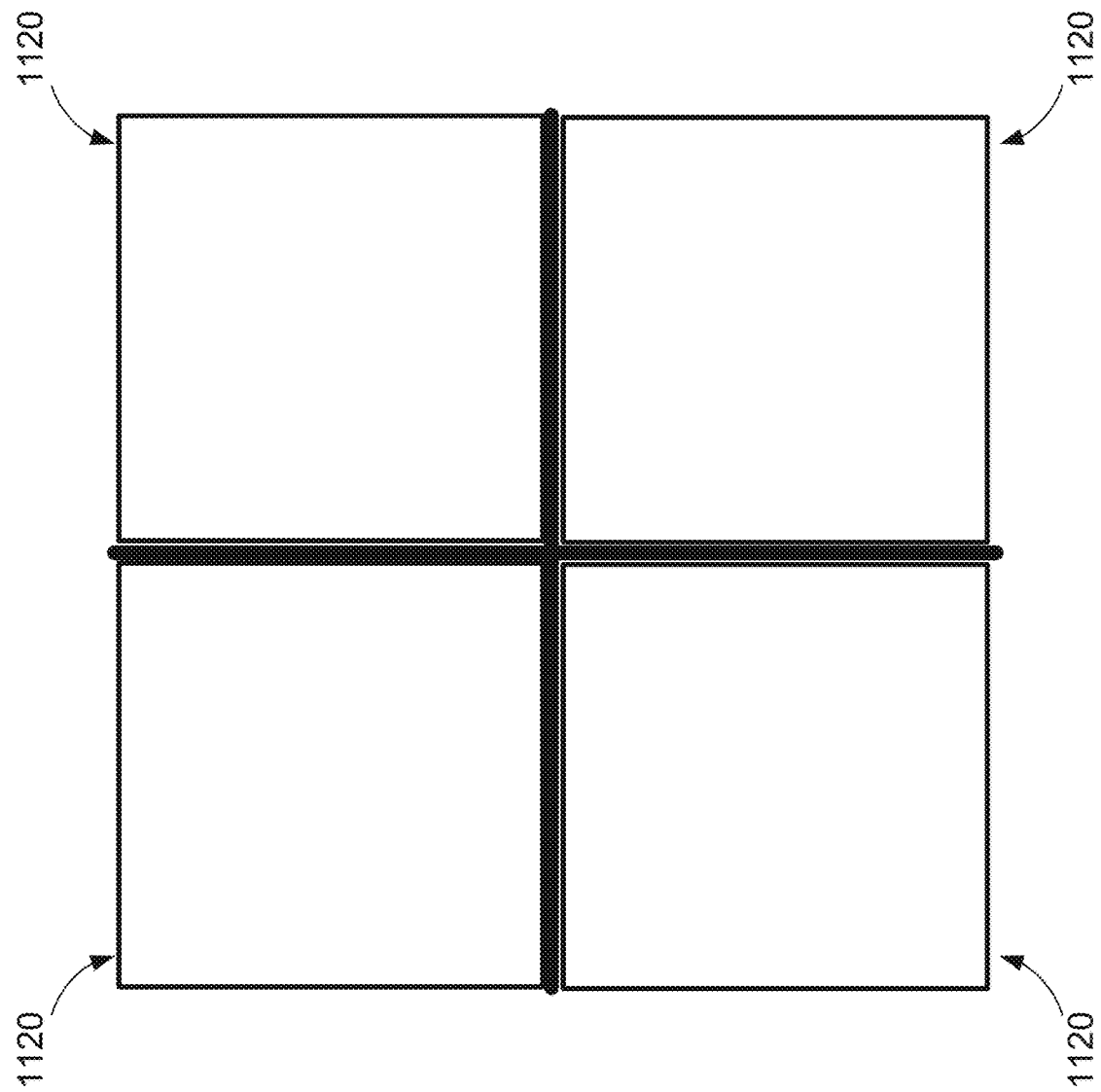
FIG. 11 schematically shows a tiled micro LED display apparatus according to certain embodiments of the present disclosure.

The embodiments of the antennas as described above may be used in different types of wireless active matrix display panels and/or display apparatuses. For example, FIG. 11 schematically shows a tiled micro LED display apparatus according to certain embodiments of the present disclosure. As shown in FIG. 11, the tiled micro LED display apparatus 1100 is formed by four micro LED display panels 1120 being joined and spliced together in a 2*2 array. Each of the four micro LED display panels 1120 has a substantially identical size, and may adopt the structures of the active matrix display panels in the embodiments as described above.

Further, the embodiments as described above are provided for the purposes of illustration and description. Although certain features may be described in different embodiments respectively, these features may be combined altogether to form other embodiments without departing from the spirit and scope of the disclosure.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An active matrix display panel, comprising:
   a pixel structure corresponding to a display area, comprising a plurality of pixels arranged in an array having M columns and N rows, wherein M and N are positive integers; and
   a receiver antenna structure disposed on the pixel structure, the receiver antenna structure comprising a plurality of first receiver antennas configured to provide power voltages to the pixels and a plurality of second receiver antennas configured to provide data signals to the pixels, wherein each of the first receiver antennas has a first resonance frequency, each of the second receiver antennas has a second resonance frequency greater than the first resonance frequency, and a first size of each of the first receiver antennas is greater than a second size of each of the second receiver antennas;
   wherein the first receiver antennas and the second receiver antennas form a plurality of receiver antenna groups, each of the receiver antenna groups comprises one of the first receiver antennas and at least one of the second receiver antennas being surrounded by the one of the first receiver antennas, and each of the second receiver antennas corresponds to at least one of the M columns and at least one of the N rows of the pixels.

2. The active matrix display panel of claim 1, wherein the first resonance frequency is in a range of 100 kHz to 1 MHz, and the second resonance frequency is 10 MHz.

3. The active matrix display panel of claim 1, wherein the first size of each of the first receiver antennas is 4 cm*4 cm, and the second size of each of the second receiver antennas is 8 mm*10 mm.

4. The active matrix display panel of claim 1, further comprising:
   a printed circuit board (PCB); and
   a transmitter antenna structure disposed on the PCB and spatially separated from the receiver antenna structure, configured to transmit wireless signals to the receiver antenna structure such that the receiver antenna structure generates the data signals and the power voltages, wherein the transmitter antenna structure comprises a plurality of first transmitter antennas and a plurality of second transmitter antennas, each of the first transmitter antennas one-to-one corresponds to one of the first receiver antennas and has an identical resonance frequency to the first resonance frequency of the corresponding one of the first receiver antennas, and each of the second transmitter antennas one-to-one corresponds to one of the second receiver antennas and has an identical resonance frequency to the second resonance frequency of the corresponding one of the second receiver antennas.

5. The active matrix display panel of claim 1, wherein:
   each of the first receiver antennas and each of the second receiver antennas has an inner feeding end and an outer feeding end;
   one of the inner feeding end and the outer feeding end of each of the first receiver antennas functions as a power feeding end, and the other of the inner feeding end and the outer feeding end of each of the first receiver antennas functions as a power reference end being provided with a power reference voltage; and
   one of the inner feeding end and the outer feeding end of each of the second receiver antennas functions as a data feeding end, and the other of the inner feeding end and the outer feeding end of each of the second receiver antennas functions as a data reference end being provided with a data reference voltage.

6. The active matrix display panel of claim 5, wherein each of the pixels comprises:
   a pixel circuit electrically connected to a corresponding first receiver antenna of the first receiver antennas and a corresponding second receiver antenna of the second receiver antennas, wherein the pixel circuit has a pixel capacitor; and a light emitting diode (LED) electrically connected to the corresponding first receiver antenna and the pixel circuit, wherein:
in a reset period, the pixel circuit is configured to control the pixel capacitor to reset;
in a data writing period immediately after the reset period, the pixel circuit is configured to control the corresponding second receiver antenna to provide a corresponding data signal to the pixel capacitor to charge the pixel capacitor to a pixel voltage level; and
in an emission period immediately after the data writing period, the charged pixel capacitor of the pixel circuit is configured to control the corresponding first receiver antenna to provide a corresponding power voltage to the LED to drive the LED to emit light based on the pixel voltage level.

7. The active matrix display panel of claim 6, wherein the LED has a cathode and an anode, the cathode of the LED is connected to one of the inner feeding end and the outer feeding end of the corresponding first receiver antenna, and the pixel circuit comprises:
the pixel capacitor having a first electrode connected to the anode of the LED and a second electrode;
an emission switch and a control switch electrically connected in series with the LED and the corresponding first receiver antenna, wherein a control end of the control switch is electrically connected to the second electrode of the pixel capacitor;
a diode electrically connected to the second electrode of the pixel capacitor;
a plurality of scan switches electrically connected in series with the corresponding second receiver antenna and the diode; and
a reset switch electrically connected to the second electrode of the pixel capacitor, wherein:
in the reset period, the reset switch is turned on, and the emission switch and at least one of the scan switches are turned off, such that the pixel capacitor is reset by the reset switch;
in the data writing period, the scan switches are turned on, and the reset switch and the emission switch are turned off, such that the corresponding second receiver antenna, the scan switches and the diode form a first closed loop to provide the corresponding data signal to the pixel capacitor to charge the pixel capacitor to the pixel voltage level; and
in the emission period, the emission switch is turned on, the reset switch and at least one of the scan switches are turned off, and the charged pixel capacitor of the pixel circuit turns on the control switch based on the pixel voltage level, such that the corresponding first receiver antenna, the emission switch, the control switch and the LED form a second closed loop to provide the corresponding power voltage to the LED to drive the LED to emit light.

8. The active matrix display panel of claim 7, wherein:
each of the receiver antenna groups comprises a plurality of the second receiver antennas arranged in an matrix having I rows and J columns, wherein I and J are positive integers;
in each of the receiver antenna groups, each of the I*J second receiver antennas corresponds to m columns and n rows of the pixels, wherein m and n are positive integers greater than 1, m<M, and n<N; and
for each of two adjacent rows of the n rows of the pixels corresponding to each of the I*J second receiver antennas, the cathode of the LED of each of the pixels in one of the two adjacent rows is connected to the outer feeding end of the corresponding first receiver antenna, and the cathode of the LED of each of the pixels in the other of the two adjacent rows is connected to the inner feeding end of the corresponding first receiver antenna.

9. The active matrix display panel of claim 8, wherein:
each of the first receiver antennas has an inner bridge structure electrically connected to the inner feeding end thereof and an outer bridge structure electrically connected to the outer feeding end thereof, and the inner bridge structure and the outer bridge structure are electrically insulated from each other;
the inner bridge structure has a plurality of inner branch lines extending along a row direction, and the outer bridge structure has a plurality of outer branch lines extending along the row direction; and
the inner branch lines and the outer branch lines are alternately disposed between the n rows of the pixels corresponding to each of the I*J second receiver antennas, such that the cathode of the LED of each of the pixels in one of the two adjacent rows is connected to the outer feeding end of the corresponding first receiver antenna through one of the outer branch lines of the outer bridge structure of the corresponding first receiver antenna, and the cathode of the LED of each of the pixels in the other of the two adjacent rows is connected to the inner feeding end of the corresponding first receiver antenna through one of the inner branch lines of the inner bridge structure of the corresponding first receiver antenna.

10. The active matrix display panel of claim 8, wherein:
the scan switches comprises a first scan switch electrically connecting the diode to one of the outer feeding end and the inner feeding end of the corresponding second receiver antenna, and a second scan switch electrically connected to the other of the outer feeding end and the inner feeding end of the corresponding second receiver antenna; and
for each of two adjacent columns of the m columns of the pixels corresponding to each of the I*J second receiver antennas, the first scan switch of each of the pixels in one of the two adjacent columns is connected to the outer feeding end of the corresponding second receiver antenna, the second scan switch of each of the pixels in the one of the two adjacent columns is connected to the inner feeding end of the corresponding second receiver antenna, the first scan switch of each of the pixels in the other of the two adjacent columns is connected to the inner feeding end of the corresponding second receiver antenna, and the second scan switch of each of the pixels in the other of the two adjacent columns is connected to the outer feeding end of the corresponding second receiver antenna.

11. The active matrix display panel of claim 10, wherein each of the second receiver antennas has an inner bridge structure electrically connected to the inner feeding end thereof and an outer bridge structure electrically connected to the outer feeding end thereof, and the inner bridge structure and the outer bridge structure are electrically insulated from each other;
the inner bridge structure has a plurality of inner branch lines extending along a column direction, and the outer bridge structure has a plurality of outer branch lines extending along the column direction; and
the inner branch lines and the outer branch lines are alternately disposed between the m columns of the pixels corresponding to each of the I*J second receiver antennas, such that the first scan switch of each of the pixels in one of the two adjacent columns is connected to the outer feeding end of the corresponding second receiver antenna through one of the outer branch lines of the outer bridge structure of the corresponding second receiver antenna, the second scan switch of each of the pixels in the one of the two adjacent columns is connected to the inner feeding end of the corresponding second receiver antenna through one of the inner branch lines of the inner bridge structure of the corresponding second receiver antenna, the first scan switch of each of the pixels in the other of the two adjacent columns is connected to the inner feeding end of the corresponding second receiver antenna through one of the inner branch lines of the inner bridge structure of the corresponding second receiver antenna, and the second scan switch of each of the pixels in the other of the two adjacent columns is connected to the outer feeding end of the corresponding second receiver antenna through one of the outer branch lines of the outer bridge structure of the corresponding second receiver antenna.

12. The active matrix display panel of claim 6, wherein the corresponding power voltage provided by the corresponding first receiver antenna is a voltage difference between the inner feeding end and the outer feeding end of the corresponding first receiver antenna, the voltage difference is a sine wave, and a sum of the reset period and the data writing period is greater than or equal to one half of a period of the sine wave.

13. A tiled light-emitting diode (LED) display apparatus, comprising:
   a plurality of LED display panels arranged in tiles, wherein each of the LED display panels comprises:
      a pixel structure corresponding to a display area, comprising a plurality of pixels arranged in an array having M columns and N rows, wherein M and N are positive integers; and
      a receiver antenna structure disposed on the pixel structure, the receiver antenna structure comprising a plurality of first receiver antennas configured to provide power voltages to the pixels and a plurality of second receiver antennas configured to provide data signals to the pixels, wherein each of the first receiver antennas has a first resonance frequency, each of the second receiver antennas has a second resonance frequency greater than the first resonance frequency, and a first size of each of the first receiver antennas is greater than a second size of each of the second receiver antennas;
      wherein the first receiver antennas and the second receiver antennas form a plurality of receiver antenna groups, each of the receiver antenna groups comprises one of the first receiver antennas and at least one of the second receiver antennas being surrounded by the one of the first receiver antennas, and each of the second receiver antennas corresponds to at least one of the M columns and at least one of the N rows of the pixels.

14. A method of driving pixels of a display panel, comprising:
   providing an active matrix display panel, comprising:
      a pixel structure corresponding to a display area, comprising a plurality of pixels arranged in a pixel array having M columns and N rows, wherein M and N are positive integers; and
      a receiver antenna structure disposed on the pixel structure, the receiver antenna structure comprising a plurality of first receiver antennas configured to provide power voltages to the pixels and a plurality of second receiver antennas configured to provide data signals to the pixels, wherein each of the first receiver antennas has a first resonance frequency, each of the second receiver antennas has a second resonance frequency greater than the first resonance frequency, and an inner diameter of each of the first receiver antennas is greater than an outer diameter of each of the second receiver antennas;
      wherein the first receiver antennas and the second receiver antennas form a plurality of receiver antenna groups, each of the receiver antenna groups comprises one of the first receiver antennas and at least one of the second receiver antennas being surrounded by the one of the first receiver antennas, and each of the second receiver antennas corresponds to at least one of the M columns and at least one of the N rows of the pixels;
      wherein each of the first receiver antennas and each of the second receiver antennas has an inner feeding end and an outer feeding end;
      wherein each of the pixels comprises a pixel circuit electrically connected to a corresponding first receiver antenna of the first receiver antennas and a corresponding second receiver antenna of the second receiver antennas, wherein the pixel circuit has a pixel capacitor; and a light emitting diode (LED) electrically connected to the corresponding first receiver antenna and the pixel circuit;
   in a reset period of each of the pixels, controlling, by the pixel circuit, the pixel capacitor to reset;
   in a data writing period of each of the pixels immediately after the reset period, controlling, by the pixel circuit, the corresponding second receiver antenna to provide a corresponding data signal to the pixel capacitor to charge the pixel capacitor to a pixel voltage level; and
   in an emission period of each of the pixels immediately after the data writing period, controlling, by the charged pixel capacitor of the pixel circuit, the corresponding first receiver antenna to provide a corresponding power voltage to the LED to drive the LED to emit light based on the pixel voltage level.

15. The method of claim 14, wherein the LED has a cathode and an anode, the cathode of the LED is connected to one of the inner feeding end and the outer feeding end of the corresponding first receiver antenna, and the pixel circuit comprises:
   the pixel capacitor having a first electrode connected to the anode of the LED and a second electrode;
   an emission switch and a control switch electrically connected in series with the LED and the corresponding first receiver antenna, wherein a control end of the control switch is electrically connected to the second electrode of the pixel capacitor;
   a diode electrically connected to the second electrode of the pixel capacitor;
   a plurality of scan switches electrically connected in series with the corresponding second receiver antenna and the diode; and
   a reset switch electrically connected to the second electrode of the pixel capacitor, wherein:

in the reset period, the reset switch is turned on, and the emission switch and at least one of the scan switches are turned off, such that the pixel capacitor is reset by the reset switch;

in the data writing period, the scan switches are turned on, and the reset switch and the emission switch are turned off, such that the corresponding second receiver antenna, the scan switches and the diode form a first closed loop to provide the corresponding data signal to the pixel capacitor to charge the pixel capacitor to the pixel voltage level; and in the emission period, the emission switch is turned on, the reset switch and at least one of the scan switches are turned off, and the charged pixel capacitor of the pixel circuit turns on the control switch based on the pixel voltage level, such that the corresponding first receiver antenna, the emission switch, the control switch and the LED form a second closed loop to provide the corresponding power voltage to the LED to drive the LED to emit light.

16. The method of claim 15, wherein:

each of the receiver antenna groups comprises a plurality of the second receiver antennas arranged in an matrix having I rows and J columns, wherein I and J are positive integers;

in each of the receiver antenna groups, each of the I*J second receiver antennas corresponds to m columns and n rows of the pixels, wherein m and n are positive integers greater than 1, m<M, and n<N; and for each of two adjacent rows of the n rows of the pixels corresponding to each of the I*J second receiver antennas, the cathode of the LED of each of the pixels in one of the two adjacent rows is connected to the outer feeding end of the corresponding first receiver antenna, and the cathode of the LED of each of the pixels in the other of the two adjacent rows is connected to the inner feeding end of the corresponding first receiver antenna.

17. The method of claim 16, wherein:

each of the first receiver antennas has an inner bridge structure electrically connected to the inner feeding end thereof and an outer bridge structure electrically connected to the outer feeding end thereof, and the inner bridge structure and the outer bridge structure are electrically insulated from each other;

the inner bridge structure has a plurality of inner branch lines extending along a row direction, and the outer bridge structure has a plurality of outer branch lines extending along the row direction; and the inner branch lines and the outer branch lines are alternately disposed between the n rows of the pixels corresponding to each of the I*J second receiver antennas, such that the cathode of the LED of each of the pixels in one of the two adjacent rows is connected to the outer feeding end of the corresponding first receiver antenna through one of the outer branch lines of the outer bridge structure of the corresponding first receiver antenna, and the cathode of the LED of each of the pixels in the other of the two adjacent rows is connected to the inner feeding end of the corresponding first receiver antenna through one of the inner branch lines of the inner bridge structure of the corresponding first receiver antenna.

18. The method of claim 16, wherein:

the scan switches comprises a first scan switch electrically connecting the diode to one of the outer feeding end and the inner feeding end of the corresponding second receiver antenna, and a second scan switch electrically connected to the other of the outer feeding end and the inner feeding end of the corresponding second receiver antenna; and for each of two adjacent columns of the m columns of the pixels corresponding to each of the I*J second receiver antennas, the first scan switch of each of the pixels in one of the two adjacent columns is connected to the outer feeding end of the corresponding second receiver antenna, the second scan switch of each of the pixels in the one of the two adjacent columns is connected to the inner feeding end of the corresponding second receiver antenna, the first scan switch of each of the pixels in the other of the two adjacent columns is connected to the inner feeding end of the corresponding second receiver antenna, and the second scan switch of each of the pixels in the other of the two adjacent columns is connected to the outer feeding end of the corresponding second receiver antenna.

19. The method of claim 18, wherein each of the second receiver antennas has an inner bridge structure electrically connected to the inner feeding end thereof and an outer bridge structure electrically connected to the outer feeding end thereof, and the inner bridge structure and the outer bridge structure are electrically insulated from each other;

the inner bridge structure has a plurality of inner branch lines extending along a column direction, and the outer bridge structure has a plurality of outer branch lines extending along the column direction; and the inner branch lines and the outer branch lines are alternately disposed between the m columns of the pixels corresponding to each of the I*J second receiver antennas, such that the first scan switch of each of the pixels in one of the two adjacent columns is connected to the outer feeding end of the corresponding second receiver antenna through one of the outer branch lines of the outer bridge structure of the corresponding second receiver antenna, the second scan switch of each of the pixels in the one of the two adjacent columns is connected to the inner feeding end of the corresponding second receiver antenna through one of the inner branch lines of the inner bridge structure of the corresponding second receiver antenna, the first scan switch of each of the pixels in the other of the two adjacent columns is connected to the inner feeding end of the corresponding second receiver antenna through one of the inner branch lines of the inner bridge structure of the corresponding second receiver antenna, and the second scan switch of each of the pixels in the other of the two adjacent columns is connected to the outer feeding end of the corresponding second receiver antenna through one of the outer branch lines of the outer bridge structure of the corresponding second receiver antenna.

20. The method of claim 14, wherein the corresponding power voltage provided by the corresponding first receiver antenna is a voltage difference between the inner feeding end and the outer feeding end of the corresponding first receiver antenna, the voltage difference is a sine wave, and a sum of the reset period and the data writing period is greater than or equal to one half of a period of the sine wave.

* * * * *